US011043985B1

(12) United States Patent
Labadie et al.

(10) Patent No.: US 11,043,985 B1
(45) Date of Patent: Jun. 22, 2021

(54) CABLE LOSS COMPENSATION SYSTEM FOR TIME DOMAIN DUPLEXED (TDD) RADIOS USING EMBEDDED RADIO FREQUENCY (RF) CONTROL

(71) Applicant: Amazon Technologies, Inc., Seattle, WA (US)

(72) Inventors: Nathan Labadie, Gilroy, CA (US); Cheol Su Kim, San Jose, CA (US); Ravi Ichapurapu, Morgan Hill, CA (US); Kalyan Teja Posani, San Jose, CA (US); Omar Fawazhashim Zakaria, Saratoga, CA (US); In Chul Hyun, Saratoga, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/892,119

(22) Filed: Jun. 3, 2020

(51) Int. Cl.
| | | |
|---|---|---|
| *H04B 3/02* | (2006.01) | |
| *H03F 3/24* | (2006.01) | |
| *H03M 1/12* | (2006.01) | |
| *H04B 3/54* | (2006.01) | |
| *H04B 1/44* | (2006.01) | |
| *H04B 1/04* | (2006.01) | |

(52) U.S. Cl.
CPC ............... *H04B 3/02* (2013.01); *H03F 3/245* (2013.01); *H03M 1/12* (2013.01); *H04B 1/0475* (2013.01); *H04B 1/44* (2013.01); *H04B 3/548* (2013.01); *H03F 2200/294* (2013.01); *H03F 2200/451* (2013.01)

(58) Field of Classification Search
CPC ............... H03F 3/245; H03F 2200/294; H03F 2200/451; H03M 1/12; H04B 1/44; H04B 3/548; H04B 1/0475
See application file for complete search history.

(56) References Cited

U.S. PATENT DOCUMENTS 7,831,213 B1 * 11/2010 Rausch .................. H04B 1/525
455/78
9,641,205 B1 * 5/2017 Hyun ..................... H04B 1/406
(Continued)

FOREIGN PATENT DOCUMENTS

WO          WO 90/07235         *  6/1990     ............... H04B 3/44

OTHER PUBLICATIONS https://www.wlanpedia.org/tech/mac/mac-ifs/ retrieved Jun. 3, 2020.

*Primary Examiner* — Sophia Vlahos
(74) *Attorney, Agent, or Firm* — Lowenstein Sandler LLP

(57) ABSTRACT

Technologies directed to cable-loss compensation are described. An apparatus includes a triplexer, a front-end module (FEM) circuit, and a control circuit. The triplexer is coupled to a radio frequency (RF) cable. The triplexer receives a first RF signal and a DC power signal from a device via the RF cable and sends a detection signal being indicative of a transmit power level of the first RF signal to the device via the RF cable. The transmit power level includes an insertion loss of the RF cable. The FEM circuit is coupled to the triplexer and includes a power amplifier (PA). The control circuit is coupled to the triplexer and measures the transmit power level of the first RF signal and converts the first RF signal into the detection signal. The control circuit sends the detection signal back to the device via the RF cable and enables the PA.

20 Claims, 27 Drawing Sheets

(56) References Cited

U.S. PATENT DOCUMENTS

| | | | |
|---|---|---|---|
| 2003/0033608 A1* | 2/2003 | Chang | H04M 7/0069 |
| | | | 725/119 |
| 2018/0152898 A1* | 5/2018 | Gossner | H04W 52/18 |
| 2019/0132063 A1* | 5/2019 | Forbes | H04B 1/18 |
| 2020/0371245 A1* | 11/2020 | Murphy | G01S 19/30 |

* cited by examiner

| RF DETECTOR | | LOGIC OUTPUT | | |
|---|---|---|---|---|
| RX_DET | TX_DET | LNA_EN | PA_EN | State |
| 0 | 0 | 1 | 0 | Receive high gain mode |
| 0 | 1 | 0 | 1 | Transmit mode |
| 1 | 0 | 0 | 0 | Receive bypass mode |
| 1 | 1 | 0 | 1 | Transmit mode |

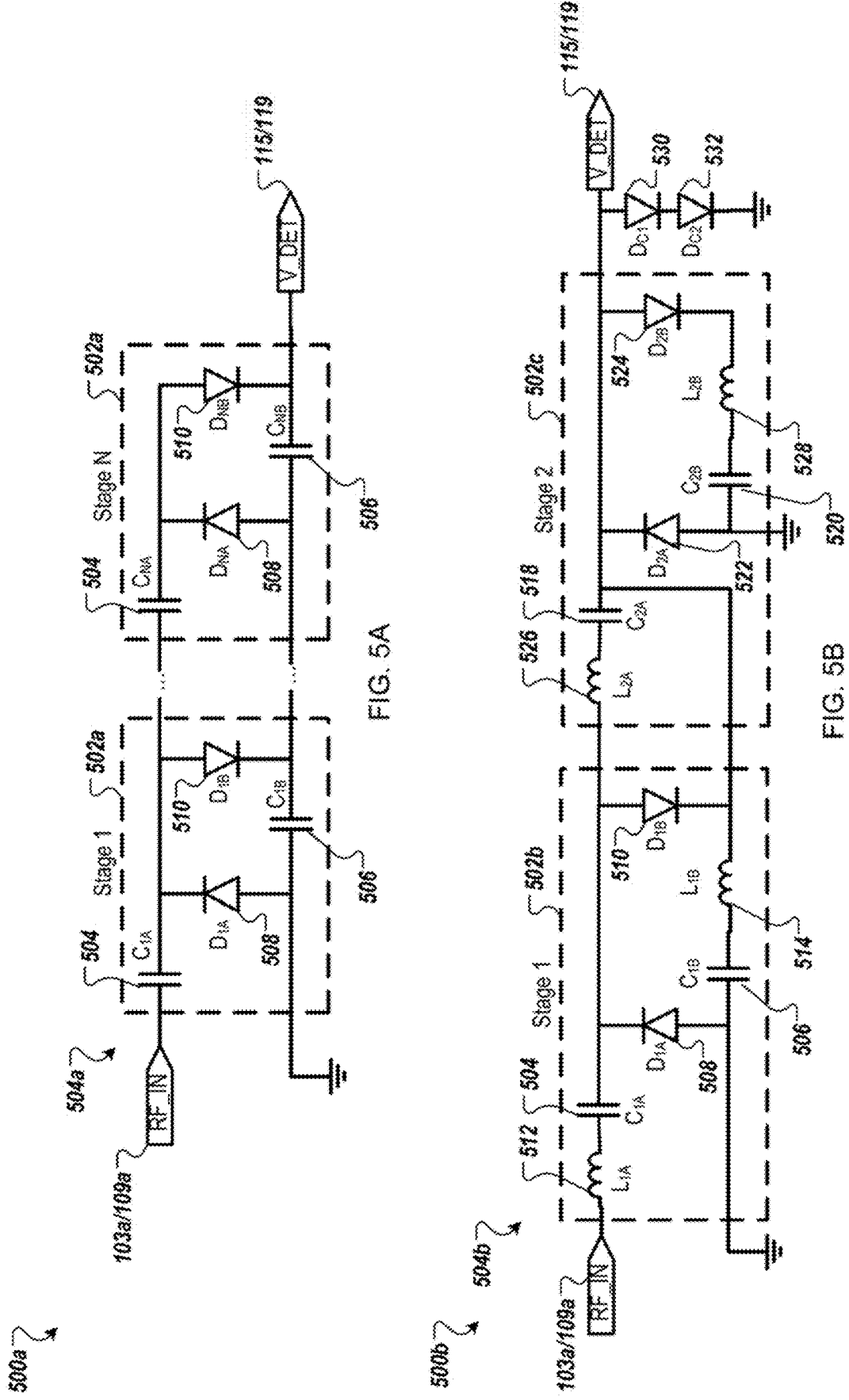

1600

| Short Training Field (STF) | Short Training Field (LTF) | Signal Field | Service Field | Data Field | Tail/ Padding |
|---|---|---|---|---|---|
| 8us (10 symbols) | 8us | 4us | 16 bits | | |

FIG. 16

| Item | | SIFS | aSlotTime |
|---|---|---|---|
| 2.4G | 11b | 10 usec | 20 usec |
| | 11g/n/ac | | 9 usec (short ST), 20 usec (long ST) |
| 5G | | 16 usec | 9 usec |

CABLE LOSS COMPENSATION SYSTEM FOR TIME DOMAIN DUPLEXED (TDD) RADIOS USING EMBEDDED RADIO FREQUENCY (RF) CONTROL

BACKGROUND

A large and growing population of users is enjoying entertainment through the consumption of digital media items, such as music, movies, images, electronic books, and so on. The users employ various electronic devices to consume such media items. Among these electronic devices (referred to herein as endpoint devices, user devices, clients, client devices, or user equipment) are electronic book readers, cellular telephones, Personal Digital Assistants (PDAs), portable media players, tablet computers, netbooks, laptops, and the like. These electronic devices wirelessly communicate with a communications infrastructure to enable the consumption of the digital media items. In order to communicate with other devices wirelessly, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

FIG. 5A is a schematic diagram of a radio frequency (RF) detector circuit of a communication device with a cable-loss compensator system according to one embodiment.

FIG. 5B is a schematic diagram of an RF detector circuit with tuning inductors of a communication device with a cable-loss compensator system according to one embodiment.

FIG. 16 illustrates a Wi-Fi TX airframe structure according to one embodiment.

FIG. 19 is a table that shows a physical definition of a short interframe space (SIFS) and a slot time according to one embodiment.

DETAILED DESCRIPTION

Figure 1:
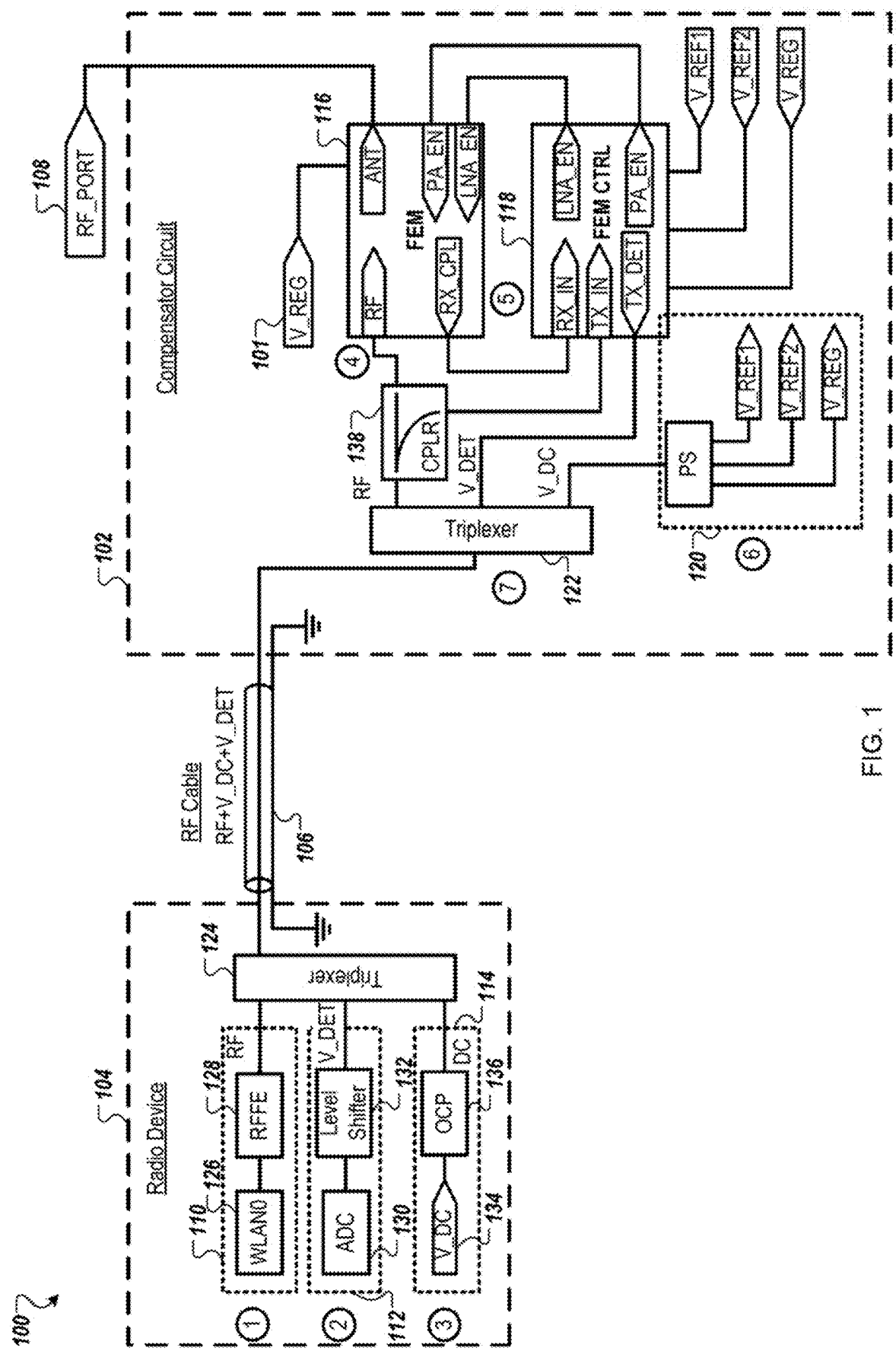
FIG. 1 is a schematic diagram of a communication device with a cable-loss compensator system according to one embodiment.

Technologies directed to compensating for cable loss for a time-domain duplexed (TDD) radio using embedded radio frequency (RF) control are described. RF cables are used to connect radios and antennas when they need to be separated by a physical distance. As such, many wireless communication devices require an RF cable connection between the radio and the antenna. RF cables are lossy and an RF signal in an RF cable experiences insertion losses that increase with the length of the RF cable. Losses in RF cables can have a number of sources, including resistive losses, dielectric losses, radiation losses, and the like. For example, in cellular networks, high transmit power base station (BS) radios (such as for eNodeB (eNB)) must be cooled due to high power dissipation. Radio towers have strict weight limits that prevent the mounting of heavy devices. For this reason, radios are housed in a cooled shed and antennas are mounted on the radio towers and connected by lossy RF cables. RF cable loss can significantly reduce achievable wireless range and coverage. Further, in fixed wireless networks, a device can contain multiple radios with disjoint coverage uses. For example, a 2.4 GHz radio can provide in-home customer connectivity, while outdoor wireless coverage is routed over an RF cabling to a 5 GHz radio. Similarly, RF cable loss can reduce achievable wireless range and coverage. One solution that can be used to mitigate effects of RF cable loss is to use low-loss RF cables. This approach typically requires an RF cable with a larger diameter and high-grade RF materials, which increases the cost. The cost to use low-loss RF cables for gigahertz frequencies can be prohibitively high, especially for cable lengths beyond 10 m. Another solution to reduce cable loss is to physically integrate the antenna with the radio. This increases the cost associated with operating the device in outdoor environments, for example for thermal management. For such a solution, additional devices may be required when coverage areas are physically separated for a sectorized system (e.g., indoor and outdoor applications).

Aspects of the present disclosure overcome the deficiencies of using low-loss RF cable and physically integrating the antenna and the radio by using a cable-loss compensation system. The compensation system allows for the option to use cheap RF cabling while maintaining the high RF performance of the integrated solution. Aspects of the present disclosure provide precisely timed low-noise receive (RX) amplification and high transmit (TX) power output at an antenna coupled to a radio by an RF cable. Operation of the compensator system is possible with minimal dependence on the radio hardware, thus making the compensator system universal for any given frequency band and protocol. Normal operation requires only direct current (DC) power and RF signaling over the RF cable between the radio and the antenna. Aspects of the present disclosure allow for low system noise figures (SNF) and high linearity output power to be realized for cable losses of up to 30 dB. Aspects of the present disclosure allow antennas to be located tens of meters from the radio with little to no perceivable performance degradation. Aspects of the present disclosure allow for significant cost savings and flexibility of RF cable types and lengths.

FIG. 1 is a schematic diagram of a communication device 100 with a cable-loss compensator system according to one embodiment. The communication device 100 includes a radio device 104 and an RF port 108 that are separated by an RF cable 106. The radio device 104 is coupled to a first end of the RF cable 106. A compensator circuit 102 is coupled between the RF cable 106 and the RF port 108. The compensator circuit 102 is coupled to a second end of the RF cable 106. The RF port 108 can be coupled directly to an antenna or can be coupled to another RF cable or other RF input/output. The cable-loss compensator system is self-contained in that the radio device 104 and the compensator circuit 102 only require a single RF cable connection.

The radio device 104 includes an RF path 110, a detection path 112, a DC path 114, and a triplexer 124. The RF path 110, the detection path 112, and the DC path 114 are coupled to the triplexer 124. The RF cable 106 is coupled between the triplexer 124 of the radio device 104 and a triplexer 122 of the compensator circuit 102. The compensator circuit 102 includes the triplexer 122, a front-end module (FEM) circuit 116, a FEM control circuit 118, and a power supply circuit 120. The FEM circuit 116 is coupled to the RF port 108. The FEM circuit 116, the FEM control circuit 118, and the power supply circuit 120 are coupled to the triplexer 122.

The RF path 110 is the primary communication path and includes a radio 126 and radio frequency front-end (RFFE) circuitry 128. The RFFE circuitry 128 is coupled between the radio 126 and the triplexer 124. The RF path 110 is the primary RF communication path and includes a single chain with TDD TX and RX capability. The radio 126 can be a wireless local area network (WLAN) radio, a Wi-Fi radio, a long term evolution (LTE) radio, or other type of radio. The radio can be a TDD radio. The radio 126 can send a first RF signal in a TX mode or receive a second RF signal in an RX mode via the RF cable 106. Though not illustrated, the RFFE circuitry 128 can include TX/RX amplifiers, such as power amplifiers (PAs), low-noise amplifiers (LNAs), variable gain amplifiers (VGAs), or the like, as well as matching circuitry for impedance matching and filters, such as high-pass filters, low-pass filters, band-pass filters (BPFs), or the like.

The detection path 112 includes an analog-to-digital converter (ADC) 130 and a level shifter 132. The detection path 112 serves to enable an insertion loss measurement of the RF cable 106 and provide feedback to set an input drive level of a PA of the radio 126 to compensate for any insertion loss of the RF cable 106. The first RF signal with a TX input RF power (TX_IN) can be converted to a DC detection voltage signal (V_DET) by a front-end module (FEM) control circuit 118. The DC detection voltage signal (e.g., the DC detection signal) can be sent by the FEM control circuit 118 to the ADC. The DC detection voltage signal is indicative of an insertion loss of the first RF signal through the RF cable 106. The ADC converts the detection voltage signal into digital data for a processing logic of the radio device 104. The level shifter 132 can be a separate component from the ADC 130, or in other embodiments, the level shifter can be integrated as part of the ADC (e.g., the ADC can have a built-in level shifter). The level shifter 132 can adjust a voltage of the DC detection voltage signal to be in a range of operation of the ADC 130.

The DC path 114 includes a DC power source 134 that provides a DC power signal. The DC power source 134 provides the DC power signal to each active component in the compensator circuit 102, including each of the RF amplifiers and logic circuits. The DC path 114 includes over-current protection (OCP) circuitry 136 coupled between the DC power source 134 and the triplexer 124. The OCP circuitry 136 can prevent damage to radio power supplies and provide operational safety. The triplexer 124 can multiplex the RF signals (e.g., the first and the second RF signals), the DC detection voltage signal, and the DC power signal onto the RF cable 106. The triplexer 124 can provide a sufficient level of signal isolation to prevent the RF signals from being degraded by the concurrent signals (e.g., the DC detection voltage signal and the DC power signal).

On the compensator circuit 102, the triplexer 122 can multiplex the RF signals, the DC detection voltage signal, and the DC power signal on the RF cable 106. The triplexer 122 can provide a sufficient level of signal isolation to prevent the RF signals from being degraded by the concurrent signals. The DC power signal from the radio device 104 is injected into the RF cable 106 and converted to a stable voltage at the compensator circuit 102 by a voltage regulator. The power supply circuit 120 receives the DC power signal and generates a regulated voltage (V_REG) 101 and multiple reference voltages (V_REFx). The regulated voltage is a primary compensator power to power the FEM circuit 116 and the FEM control circuit 118. The multiple reference voltages are used for logic switching decisions. The voltage regulator can be a low drop-out (LDO) regulator, a switching regulator, a linear regulator, or the like. The type of regulator used can affect desired efficiency and noise characteristics.

The FEM circuit 116 includes circuitry for the RF path for transmission and reception of RF signals. The FEM circuit 116 includes amplifiers, RF switches for TX/RX paths, and passive couplers and filters. The FEM circuit 116 includes at least one PA and at least one LNA, but can include additional PAs, LNAs, or other types of amplifiers. The RF switches can be used to switch between a TX mode and an RX mode, depending on an operation mode of the communication device 100, by switching between RF signal paths (e.g., between one or more TX paths or one or more RX paths). The radio 126 operates either in a TX mode or an RX mode at any given time. In general, because operating in the RX mode is less power intensive, the radio 126 operates in the RX mode until it needs to send an RF signal, at which point it switches to TX mode for the duration required to send the RF signal. For example, this block can consume most of the DC power supplied to the compensator circuit 102 due to PA output power (e.g., 20-30 dBm) and efficiency (10-20%). The FEM circuit 116 is coupled to the RF port 108 and can send or receive RF signals via an antenna coupled to the RF port 108. Alternatively, the RF port 108 can be coupled to another RF input or output, such as another RF cable.

The FEM control circuit 118 controls precision timed switching between TX and RX paths. A FEM control circuit 118 uses dedicated control pins to switch between the TX and RX paths. In particular, the FEM control circuit 118 generates digital path selection signals (PA_EN and LNA_EN) to enable the PA or the LNA of the FEM circuit 116. As detailed herein, the digital path selection signals are generated directly from the RF signals (e.g., the first RF signal and/or the second RF signal). In order to generate the digital path selection signals, the FEM control circuit 118 includes RF detection circuitry (TX_DET and RX_DET) and logic circuit components (such as comparators, logic gates, and the like). The precision timing of the switching can be maintained by careful selection of components for the RF detection circuitry and the logic circuitry.

At a given time, the radio 126 sends a first RF signal in a TX mode or receives a second RF signal in an RX mode. The DC power source 134 provides a DC power signal at a first voltage value. The FEM control circuit 118 measures a TX input power of the first RF signal at the triplexer 122 and converts the first RF signal to a first DC detection voltage signal. The first DC detection voltage signal is indicative of the TX input power of the first RF signal. The FEM control circuit 118 sends the first DC detection voltage signal back to the ADC 130 via the RF cable 106. The ADC 130 converts the first DC detection voltage signal into digital data for the processing logic of the radio device 104. The processing logic determines an insertion loss measurement of the RF cable using the first DC detection voltage signal and adjusts a TX power level of the first RF signal by increasing or decreasing the first voltage value (of the DC power signal) to a second voltage value according to the insertion loss measurement. Additionally or alternatively, the processing logic can adjust a gain setting of a power amplifier of a radio to adjust the TX power level of the first RF signal. The processing logic may only need to determine the insertion loss measurement a single time for the RF cable 106. In some cases, the RF cable 106 can be switched for another RF cable, and the processing logic can determine an insertion loss measurement of the other cable. In other cases, the processing logic can determine the insertion loss measurement periodically or more than once. The TX power level can be adjusted to compensate for the insertion loss from the RF cable 106.

The FEM control circuit 118 can select an RF path (e.g., between one or more TX/RX paths) to enable one or more TX or RX modes based on a DC detection voltage signal. The FEM control circuit 118 can send a first enable signal to the PA of the FEM circuit 116 to enable the TX mode and the FEM control circuit can send a second enable signal to the LNA of the FEM circuit 116 to enable the RX mode. In one embodiment, the FEM control circuit 118 determines that the first DC detection voltage signal (of the first RF signal) is greater than the first reference voltage (e.g., the first reference signal generated by the power supply circuit 120) and sends the first enable signal to the PA of the FEM circuit 116. In another embodiment, the FEM control circuit 118 measures an RX input power of the second RF signal and converts the second RF signal to a second DC detection voltage signal. The second DC detection voltage signal is indicative of the RX input power. The FEM control circuit 118 determines that the second DC detection voltage signal is greater than the second reference voltage (e.g., the second reference signal generated by the power supply circuit 120) and sends the second enable signal to the LNA of the FEM circuit 116. In some cases, FEM control circuit 118 can determine that the second DC detection voltage is above an RX threshold value, and the FEM control circuit 118 sends a third enable signal to enable a second RX mode.

In another embodiment, the RX mode is enabled by default and the FEM control circuit 118 does not send an enable signal (such as the second enable signal) to the FEM circuit 116 to enable the RX mode. In the RX mode, the radio 126 can receive RF signals. The FEM control circuit 118 determines that the first DC detection voltage signal is greater than the first reference voltage and sends the first enable signal to the FEM circuit 116 to enable the TX mode. Once the radio 126 is finished transmitting the first RF signal, the TX mode is automatically disabled, and the RX mode is automatically enabled. When the second RF signal is received by the antenna coupled to the RF port 108, the FEM control circuit 118 may determine that the corresponding second DC detection voltage is greater than the RX threshold value, and the FEM control circuit 118 sends the third enable signal to enable the second RX mode. An RF path of the second RX mode can include additional LNAs. By adjusting the cascaded LNA gains and noise figures in the RX path of the second RF signal, the SNF of the communication device 100 can be reduced.

The RF cable can be a coaxial cable that is conformable, semi-rigid, a flexible cable, or the like. The antenna can be a suitable antenna such as a dipole antenna, a monopole antenna, a loop antenna, a planar inverted F antenna, or other type of suitable antenna.

Figure 2A:
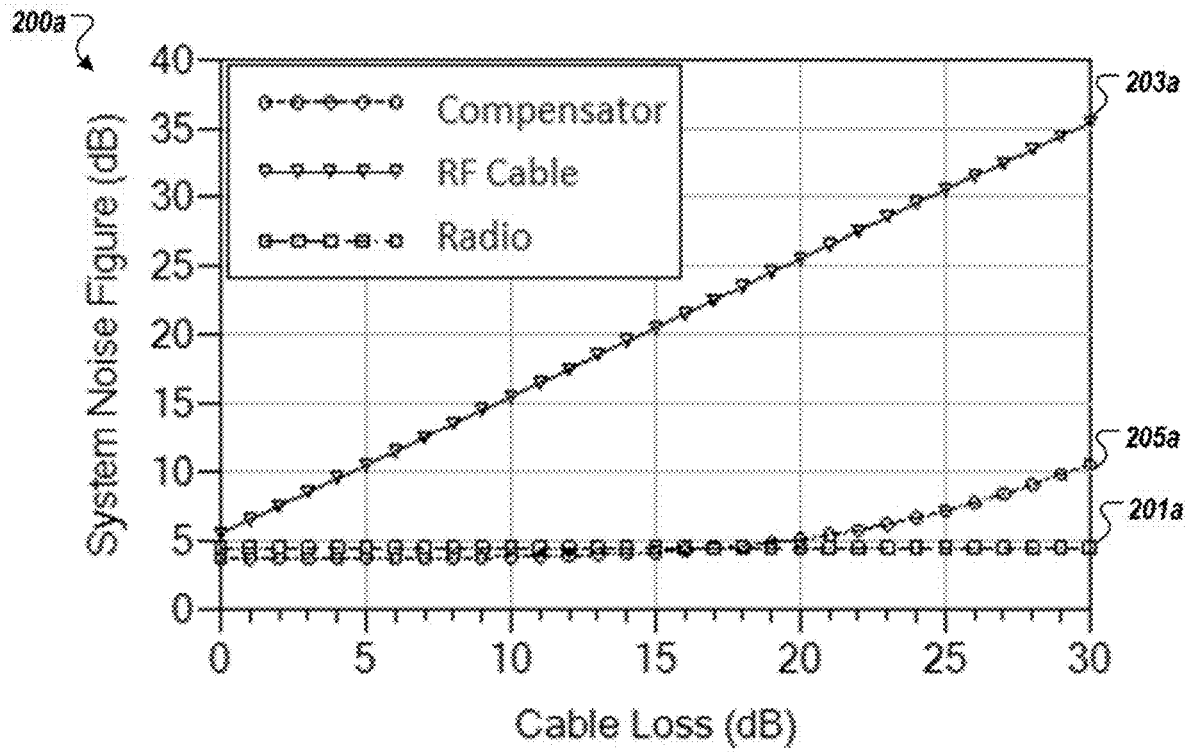
FIG. 2A is a graph of a system noise figure (SNF) as a function of cable loss according to one embodiment.

FIG. 2A is a graph 200*a* of an SNF as a function of cable loss according to one embodiment. The cable-loss compensator system can allow for low SNF that is comparable to an integrated architecture (e.g., an architecture in which the antenna is physically integrated with the radio). The graph 200a illustrates the SNF of the integrated architecture (curve 201a), a conventional communication device without the cable-loss compensator system (curve 203a), and the communication device with the cable-loss compensator system (curve 205a) as a function of cable loss for an RX mode. For example, the cable loss can be affected primarily by a length of the RF cable, as well as other factors such as cable quality, types and qualities of connectors, and the like. The communication device with the cable-loss compensator system can be the same communication device 100 of FIG. 1. The communication device with the cable-loss compensator system (curve 205a) outperforms the conventional communication device (curve 203a) by more than 20 dB, which can allow the communication device with the cable-loss compensator system to achieve approximately a three-time range improvement over the conventional communication device.

Figure 2B:
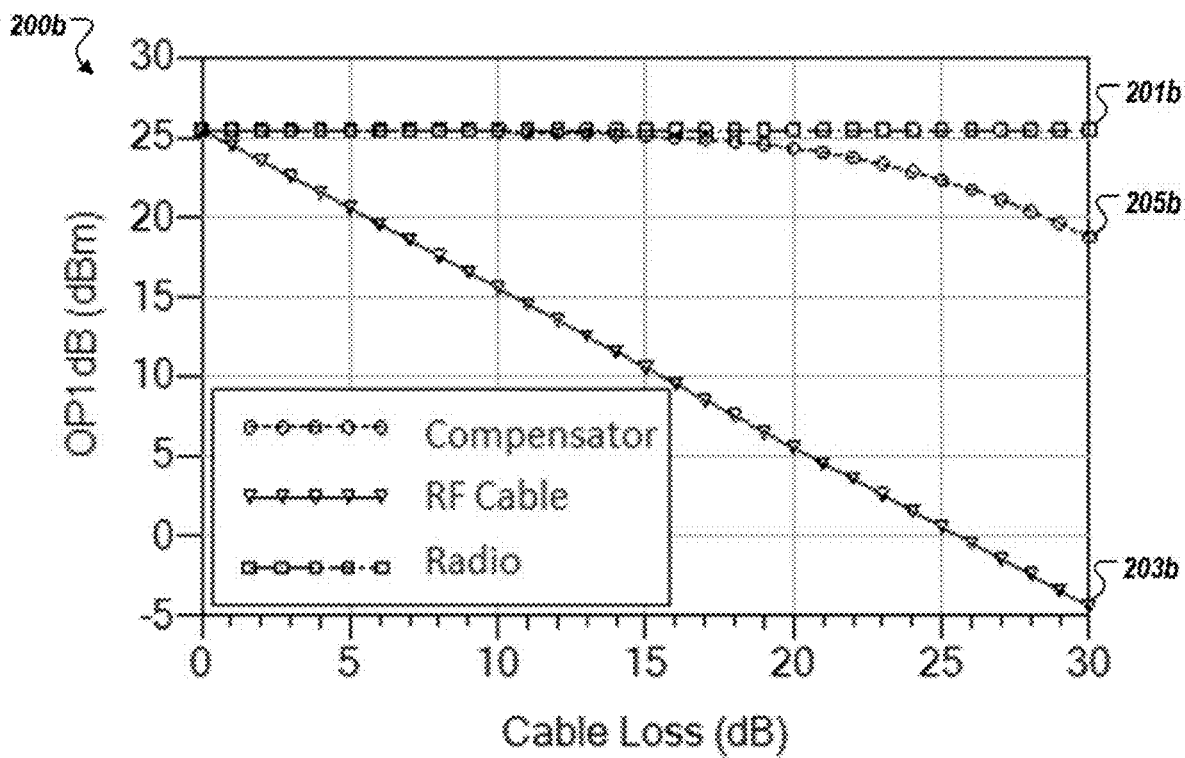
FIG. 2B is a graph of a linear (1 dB compression) output power (OP1dB) as a function of cable loss according to one embodiment.

FIG. 2B is a graph 200b of a linear (1 dB compression) output power (OP1dB) as a function of cable loss according to one embodiment. The cable-loss compensator system can allow for high output power (OP) that is comparable to an integrated architecture. The graph 200b illustrates the OP of the integrated architecture (curve 201b), a conventional communication device without the cable-loss compensator system (curve 203b), and the communication device with the cable-loss compensator system (curve 205b) as a function of cable loss for a TX mode. The communication device with the cable-loss compensator system can be the same communication device 100 of FIG. 1. The communication device with the cable-loss compensator system (curve 205b) outperforms the conventional communication device (curve 203a) by more than 20 dB, which can allow the communication device with the cable-loss compensator system to achieve approximately a three-time range improvement over the conventional communication device.

Figure 3:
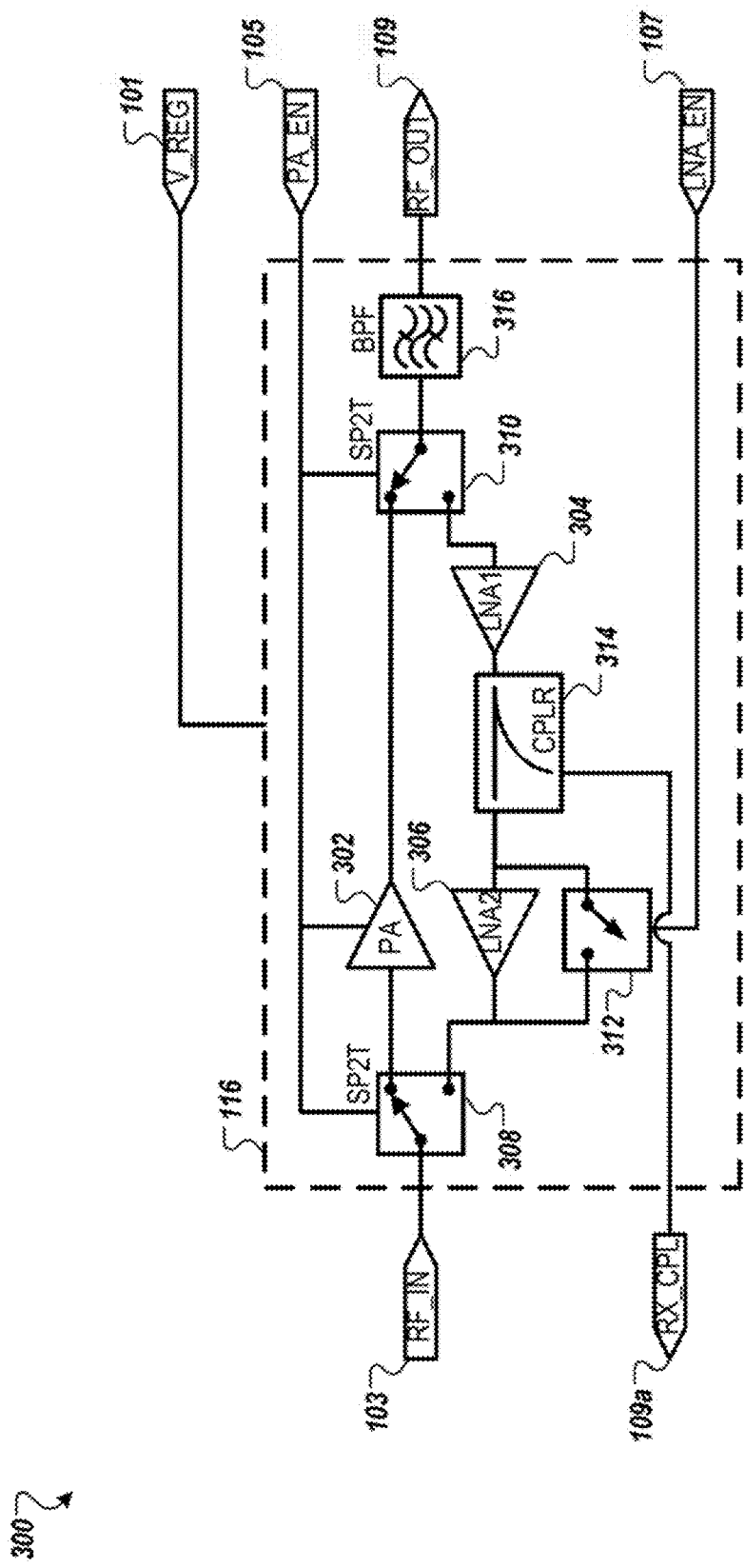
FIG. 3 is a schematic diagram of a front-end module (FEM) circuit of a communication device with a cable-loss compensator system according to one embodiment.

FIG. 3 is a schematic diagram of a FEM circuit 116 of a communication device 300 with a cable-loss compensator system according to one embodiment. Although not all components of the communication device 300 are shown, the FEM circuit 116 and the communication device 100 are the same as the FEM circuit 116 and the communication device 100 of FIG. 1. The FEM circuit 116 includes a set of RF components on selectable TX and RX paths (also referred to as chains). All of the active components of the FEM circuit 116 are powered by the regulated voltage 101 (V_REG). A first switch 308 and a second switch 310 can be controlled to toggle between the TX path and the RX path. The FEM circuit includes a first RF port (RF_IN) and a second RF port (RF_OUT). The FEM circuit 116 includes a PA 302 on the TX path and a first LNA 304, and a second LNA 306 on the RX path. Other embodiments can include more LNAs or more PAs, such as multiple input or output stages. In the depicted embodiment, the first switch 308 and the second switch 310 are configured to route a first RF signal on the TX path in the TX mode from the radio to the antenna. In the TX mode, the FEM circuit 116 receives the first RF signal 103 from the triplexer 122 (not shown in FIG. 3) at the first RF port and the first RF signal is transmitted at the second RF port (RF_OUT) via the TX path. The PA 302 and a BPF 316 are on the TX path of the RF signal. The PA 302 is enabled by a first enable signal 105 (PA_EN) that is high from the FEM control circuit (i.e., the FEM control circuit 118, not shown in FIG. 3). The PA 302 amplifies the first RF signal. The BPF 316 can select a portion of the first RF signal within a frequency range of interest. In other embodiments, the path does not include a BPF. In particular, the BPF 316 filters out out-of-band emissions and mitigates the impact of out-of-band jammers. When the PA 302 receives the first enable signal that is low, the PA 302 is powered off and the communication device 300 switches to an RX mode.

In another embodiment, the first switch 308 and the second switch 310 can be configured to route a second RF signal on either a first RX path or a second RX path in the RX mode from the antenna to the radio. The switch 312 can be configured to route the second RF signal on the first RX path or the second RX path. The FEM circuit 116 receives a second RF signal 109 at the second RF port via an antenna (not shown in FIG. 3) coupled to the second RF port. A directional coupler 314 is on the RX paths (the first RX path and the second RX path). The directional coupler 314 makes a second copy 109a (e.g., a third RF signal) (RX_CPL) of the second RF signal 109. In one embodiment, the third RF signal is based on the second RF signal. In another embodiment, the third RF signal is the same as or equal to the second RF signal. The second copy 109a of the second RF signal can be routed through an amplifier (not shown in FIG. 3), converted to the second DC detection voltage signal, and compared to a second reference voltage. In a first case, the FEM control circuit determines that the second DC detection voltage signal is greater than the reference voltage and the switch 312 is configured to be closed and the second RF signal is routed on the first RX path. The BPF 316 and the first LNA 304 are on the first RF path. In a second case, the FEM control circuit determines that the second DC detection voltage signal is less than the second reference voltage value and sends the second enable signal 107 (LNA_EN). The second enable signal 107 enables the second LNA 306 (e.g., by opening the switch 312 and forcing the second RF signal through the second LNA 306), causing the second RF signal to be amplified a second time. Strong RX RF signals can cause signal distortion at either the compensator circuit or the radio. Routing the second RF signal to the first RX path (e.g., not including the second LNA 306) reduces or eliminates the distortion by not amplifying a sufficiently strong second RF signal twice.

Though depicted as having one PA and two LNAs, in other embodiments, the FEM circuit can have additional PAs and LNAs, such as two, three, four, and the like that can be stacked for additional fine tuning. The first switch 308 and the second switch 310 are 2 terminal switches while the switch 312 is a single terminal (e.g., open/close) switch. In other embodiments, the first switch 308, the second switch 310, and the switch 312 can be other types of switches or they can all be configured to be 2 terminal switches, or the like.

Figures 4A, 4B:
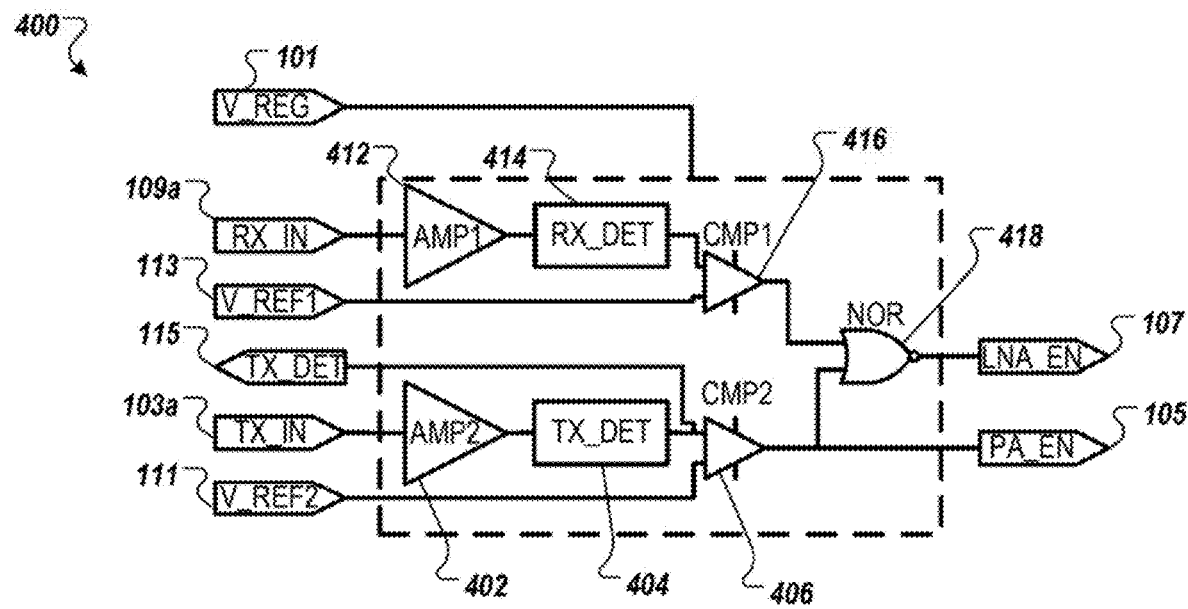
FIG. 4A is a schematic diagram of a FEM control circuit of a communication device with a cable-loss compensator system according to one embodiment.
FIG. 4B is a table indicating possible outputs of the FEM control circuit according to one embodiment.

FIG. 4A is a schematic diagram of a FEM control circuit 118 of a communication device 400 with a cable-loss compensator system according to one embodiment. Although not all components of the communication device 400 are shown, the FEM control circuit 118 and the communication device 100 are the same as the FEM control circuit 118 and the communication device 100 of FIG. 1. The FEM control circuit 118 includes a first amplifier 402, a second amplifier 412, a TX detection circuit 404, an RX detection circuit 414, a first comparator 406, a second comparator 416, and a NOR logic gate 418.

The first amplifier 402 receives a first copy 103a (e.g., a fourth RF signal) (TX_IN) of the first RF signal from a directional coupler 138 coupled to the triplexer 122 and amplifies the first copy 103a of the first RF signal. In one embodiment, the fourth RF signal is based on the first RF signal. In another embodiment, the fourth RF signal is the same as or equal to the first RF signal. The directional coupler 138 generates the first copy 103a of the first RF signal 103. The TX detection circuit 404 receives the first copy 103a of the first RF signal. The TX detection circuit 404 converts the first copy 103a to the first DC detection voltage signal 115 that is indicative of the TX input power (e.g., a peak power or voltage) of the first RF signal. The TX detection circuit 404 sends the first DC detection voltage signal to the ADC via the triplexer 122 and the RF cable 106. The first DC detection voltage signal is also a first input to the first comparator 406. A second input to the first comparator 406 is the first reference voltage 111 (e.g., a first reference threshold). When the first DC detection voltage signal is greater than the first reference voltage 111 the output of the first comparator 406 swings high (e.g., 1).

The second amplifier 412 receives the second copy 109a (e.g., RX_CPL from FIG. 3) from the directional coupler 314 (not shown in FIG. 4A) of the FEM circuit 116 of FIG. 3. The second copy 109a is a copy of the second RF signal 109. The second amplifier 412 amplifies the second copy 109a. The RX detection circuit 414 receives the second copy 109a. The RX detection circuit 414 converts the second copy 109a to the second DC detection voltage signal that is indicative of the RX input power of the second RF signal. The second DC detection voltage signal is a first input to the second comparator 416. A second input to the second comparator 416 is the second reference voltage 113 (e.g., a second reference threshold). When the second DC detection voltage signal is greater than second reference voltage 113, the output of the second comparator 416 swings high (e.g., 1), indicating that the second RF signal is a strong RX signal. The output of the first comparator 406 and the output of the second comparator 416 are inputs to the NOR logic gate 418. The output of the NOR logic gate 418 is high when the output of the first comparator 406 and the output of the second comparator 416 are both low (e.g., 0). In a first case, the first RF signal is not present, and the second RF signal is weak (e.g., the second DC detection voltage signal is less than the second reference voltage 113).

The output of the NOR logic gate 418 is high only when the output of the first comparator 406 is low (e.g., 0) and the output of the second comparator 416 is low. This corresponds to an RX high gain mode (e.g., the first RF signal is not present and the second RF signal is weak). When the output of the NOR logic gate 418 is high, the FEM control circuit 118 sends the second enable signal 107 (LNA_EN) (e.g., the LNA_EN signal is high) to enable the second LNA 306 (not shown in FIG. 4A) of the FEM circuit 116 in order to further amplify the second RF signal 109. In another case, when the output of the second comparator 416 is high, and the output of the first comparator is low (e.g., the first RF signal is not present and the second RF signal is strong), the output of the NOR logic gate 418 is low. This corresponds to an RX bypass mode in which the second RF signal does not need to be further amplified by the second LNA 306. The FEM control circuit 118 does not send the second enable signal (meaning that LNA_EN is disabled) only in the presence of a strong RX signal and no TX signal. It should be noted that the FEM control circuit 118 is shown as an illustrative example corresponding to the FEM circuit 116 of FIG. 3. It should be noted that other FEM circuits (besides the example depicted in FIG. 3) can be used, and therefore other logic circuits can be used in the FEM control circuit depending on the control states of the specific FEM circuit in use.

Each power detector circuit (the TX detection circuit 404 and the RX detection circuit 414) can have a fast transient response time (e.g., rise and fall times). In some embodiments, such as for Wi-Fi based protocols the slew rate of the power detectors should be less than approximately 1 μs to avoid significant truncation of a transmit frame training field symbol.

FIG. 4B is a table 401 indicating possible outputs of the FEM control circuit 118 according to one embodiment. When the first enable signal (PA_EN) is low and the second enable signal (LNA_EN) is high, the FEM control circuit 118 causes the FEM circuit 116 to operate in a "receive high gain mode." The "receive high gain mode" corresponds to the second RX path of the second RX mode as described in reference to FIG. 3. In the "receive high gain mode," the second LNA 306 is enabled (e.g., switched into the RX path by the switch 312). When the first enable signal is low and the second enable signal is low, the FEM control circuit 118 causes the FEM circuit 116 to operate in a "receive bypass mode." The "receive bypass mode" corresponds to the first RX path of the first RX mode as described in reference to FIG. 3. In the "receive bypass mode," the second LNA 306 is disabled (e.g., switched out of the RX path by the switch 312).

When the first enable signal is high and the second enable signal is low, the FEM control circuit 118 causes the FEM circuit 116 to operate in a "transmit mode." In a first "transmit mode," a TX RF signal is present and no RX RF signal is present. In a second "transmit mode," a TX RF signal is present and an RX RF signal is present. The FEM circuit 116 operates in the "transmit mode" any time a TX RF signal is present, regardless of whether or not an RX RF signal is present. The "transmit mode" corresponds to the TX path of the TX mode as described in reference to FIG. 3. In the "transmit mode," the PA 302 is enabled.

In other embodiments, the logic circuitry can be different than in the depicted embodiment. For example, the FEM control circuit can measure an input power of the first RF signal (also referred to as a transmit input power) at the first triplexer 122 and convert the first RF signal to the first DC detection voltage signal that is indicative of an input power of the first RF signal that is input to the FEM control circuit, and the FEM control circuit can send a first enable signal to the FEM circuit 116 in the TX mode to enable the PA in the TX mode. The radio processor can determine an insertion loss of the RF cable 106 using the digital data from the ADC and adjust a transmit power level of the first RF signal (e.g., a power level for transmitting the first RF signal) by increasing or decreasing the DC power signal according to the insertion loss measurement or by adjusting a gain setting of a PA on the radio side. Further the FEM control circuit can measure an input power level of the second RF signal (also referred to as an RX input power level) and convert the second RF signal to a second DC detection voltage that is indicative of the RX input power. The FEM control circuit 118 can determine that the DC detection voltage signal is greater than the second reference voltage and send a second enable signal to the FEM circuit 116 to enable the LNA bypass circuit (e.g., enable the receive bypass mode) to allow the second RF signal to bypass the second LNA. In one embodiment, the TX detection circuit measures the peak power of the first RF signal corresponding to the input power of the first RF signal, while the RX detection circuit measures the peak power of the second RF signal, corresponding to the input power of the second RF signal. In other embodiments, the TX detection circuit can measure an average power or other power corresponding to the first RF signal while the RX detection circuit can measure an average power or other power corresponding to the second RF signal.

In other embodiments, the logic circuitry of the FEM control circuit 118 can be designed such that the FEM circuit 116 operates in the "transmit mode" whenever the first RF signal is present and operate in the "high gain receive mode" or the "receive bypass mode" when the first RF signal is not present. The logic circuitry of the FEM control circuit 118 can be designed such that the FEM circuit 116 operates in the "receive bypass mode" anytime the first RF signal is not present and the second RF signal is sufficiently strong (e.g., the second DC detection voltage signal is greater than the second reference voltage). The logic circuitry of the FEM control circuit 118 can be designed such that the FEM circuit 116 operates in the "receive high gain mode" at all other times.

FIG. 5A is a schematic diagram of an RF detector circuit 504a of a communication device 500a with a cable-loss compensator system according to one embodiment. Although not all components of the communication device 500a are shown, the communication device 500a is the same or similar as the communication device 100 of FIG. 1. The RF detector circuit 504a is the same as the TX detection circuit 404 and the RX detection circuit 414 of FIG. 4. The RF detector circuit 504a is an N-stage voltage multiplier including multiplier stages 502a (e.g., stage 1, stage 2, stage 3, ..., stage N). Each multiplier stage 502a includes a first capacitor 504, a second capacitor 506, a first diode 508, and a second diode 510 arranged as a ladder circuit to convert RF power into DC voltage. The diodes (e.g., the first diode 508 and the second diode 510) can be arranged as voltage-dependent switches that incrementally charge up the capacitors (e.g., the first capacitor 504 and the second capacitor 506). In the depicted embodiment, the RF detector circuit 504a is an N-stage half-wave multiplier circuit, since each capacitor is only charged on half of an RF sinusoidal cycle. When the input RF signal (e.g., the first copy 103a of the first RF signal 103 or the second copy 109a of the second RF signal 109) swings negative, the first diode 508 is forward biased and charges the first capacitor 504. The first diode 508 is switched off when the input RF signal swings positive, resulting in the forward biasing of the second diode 510 and the charging of the second capacitor 506. The N-stage multiplier circuit results in an output voltage of the RF detector circuit 504a of approximately $2NV_{RF}$, where $V_{RF}$ is the peak RF voltage of the input RF signal at the input (RF_IN) of the RF detector circuit 504a. When the RF detector circuit 504a receives the first copy 103a of the first RF signal 103, it generates a first DC detection voltage signal 115 that is input into the first comparator 406 (not shown in FIG. 5A) of FIG. 4. When the RF detector circuit 504a receives the second copy 109a of the second RF signal 109, it generates a second output voltage signal 119 that is input into the second comparator 416 (not shown in FIG. 5A) of FIG. 4. In one embodiment, the diodes are Schottky diodes with diode capacitances of between 0.5 pico-Farads (pF) and 1 pF. In other embodiments, the diodes can be other types of diodes, such as PN junctions, Zener diodes, and the like.

FIG. 5B is a schematic diagram of an RF detector circuit 504b with tuning inductors of a communication device 500b with a cable-loss compensator system according to one embodiment. The RF detector circuit 504b is similar to the RF detector circuit 504a except that a first inductor 512 is added and coupled in series to the first capacitor 504, and a second inductor 514 is added and coupled in series to the second capacitor 506. The first inductor 512 and the second inductor 514 can be referred to as tuning inductors. The addition of the first inductor 512 and the second inductor 514 can increase the output voltage (V_DET) of the RF detector circuit 504b compared to the output voltage of the RF detector circuit 504a. The first inductor 512 is coupled in series to the first capacitor 504 and the second inductor 514 is coupled in series to the second capacitor 506. The first inductor 512 and the second inductor 514 can cancel diode capacitances of the first diode 508 and the second diode 510, which can affect the charging of the first capacitor 504 and the second capacitor 506. In one embodiment, the inductors can be selected to have inductances of between 5 nano-Henrys (nH) and 10 nH to resonate at 2.4 GHz and cancel the diode capacitances. In other embodiments, inductors can be selected with different inductance values to resonate at other frequencies, such as 5 GHz or other frequencies. The RF detector circuit 504b can be scaled to other frequencies including 5 GHz by selecting appropriate component values (e.g., of inductors, capacitors, diodes, and the like).

The RF detector circuit 504b also differs from the RF detector circuit 504a regarding the coupling between a first stage 502b and a second stage 502c. The reversed biased diode output of the first stage 502b is connected to the reversed biased diode input of the second stage 502c, which increases performance of the RF detector circuit 504b. Further, the output of the second stage 502c can be limited to a maximum of approximately 2 V forward-biased clamping diodes 530 and 532.

When the RF detector circuit 504b receives the first copy 103a of the first RF signal 103, it generates a first DC detection voltage signal 115 that is input into the first comparator 406 (not shown in FIG. 5B) of FIG. 4. When the RF detector circuit 504b receives the second copy 109a of the second RF signal 109, it generates a second output voltage signal 119 that is input into the second comparator 416 (not shown in FIG. 5B) of FIG. 4. It should be noted that a variety of RF detector circuits (e.g., voltage detector circuits) can be used rather than the depicted RF detector circuit 504b, and the choice of the type of RF detector circuit can depend on case use and technical requirements.

Figure 6A:
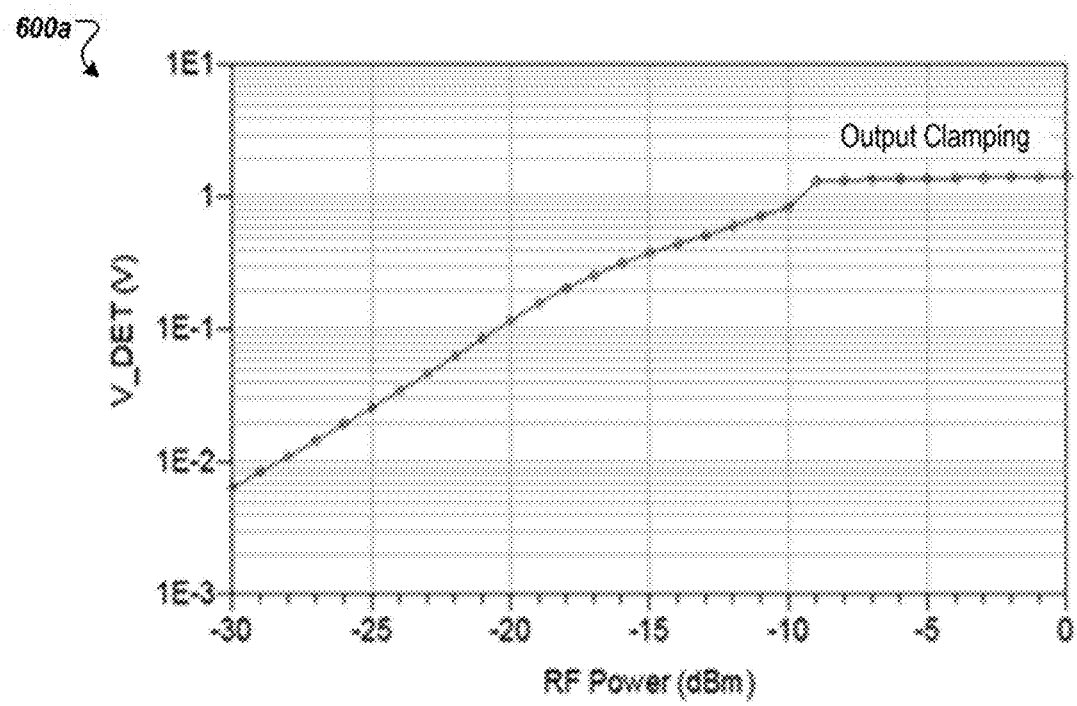
FIG. 6A is a graph illustrating an output voltage (V_DET) as a function of input RF signal power of an RF detector circuit according to one embodiment.

FIG. 6A is a graph 600a illustrating an output voltage (V_DET) as a function of input RF signal power of an RF detector circuit according to one embodiment. A minimum detectable signal (MDS) can be limited by the reference voltages (e.g., the first reference voltage 111 and the second reference voltage 113) that are fed into the comparators of the FEM control circuit 118. For example, if the reference voltage is 200 mV, the MDS can be approximately −15 dBm over a 200 MHz bandwidth. The bandwidth of the RF detector circuit can be limited by BPF characteristics of the coupled series LC resonators.

Figure 6B:
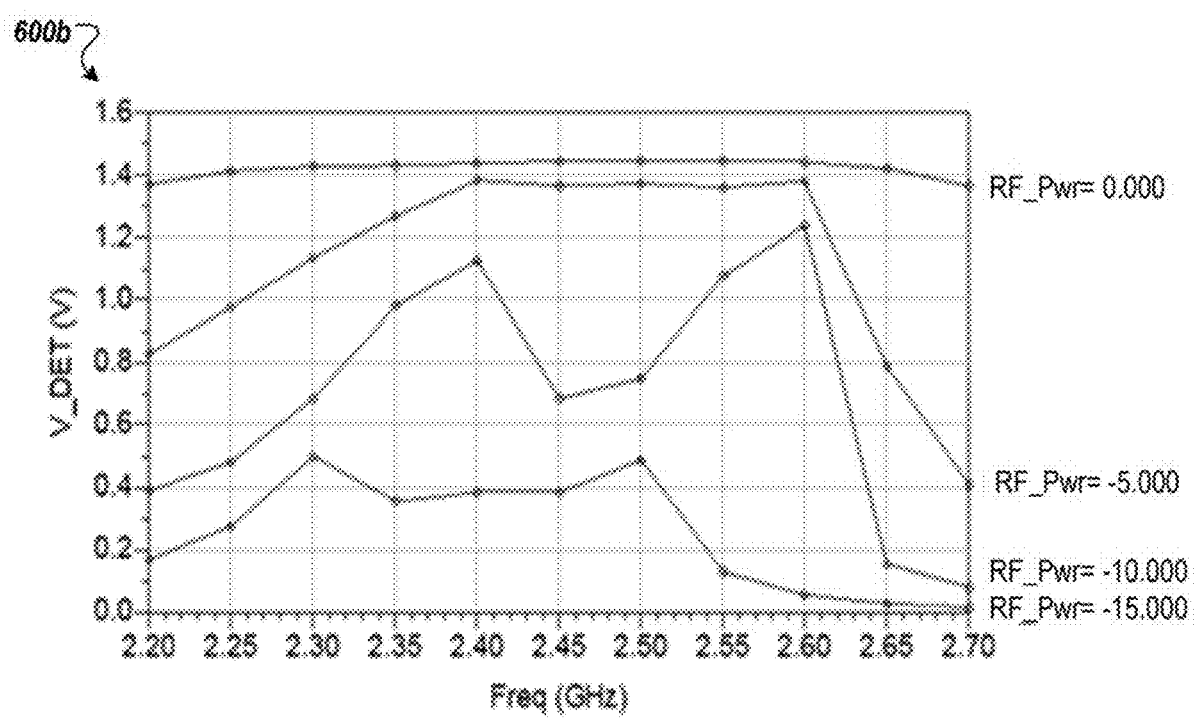
FIG. 6B is a graph 600b illustrating an output voltage (V_DET) as a function of operating frequency of an RF detector circuit according to one embodiment.

FIG. 6B is a graph 600b illustrating an output voltage (V_DET) as a function of operating frequency of an RF detector circuit according to one embodiment.

Figure 7:
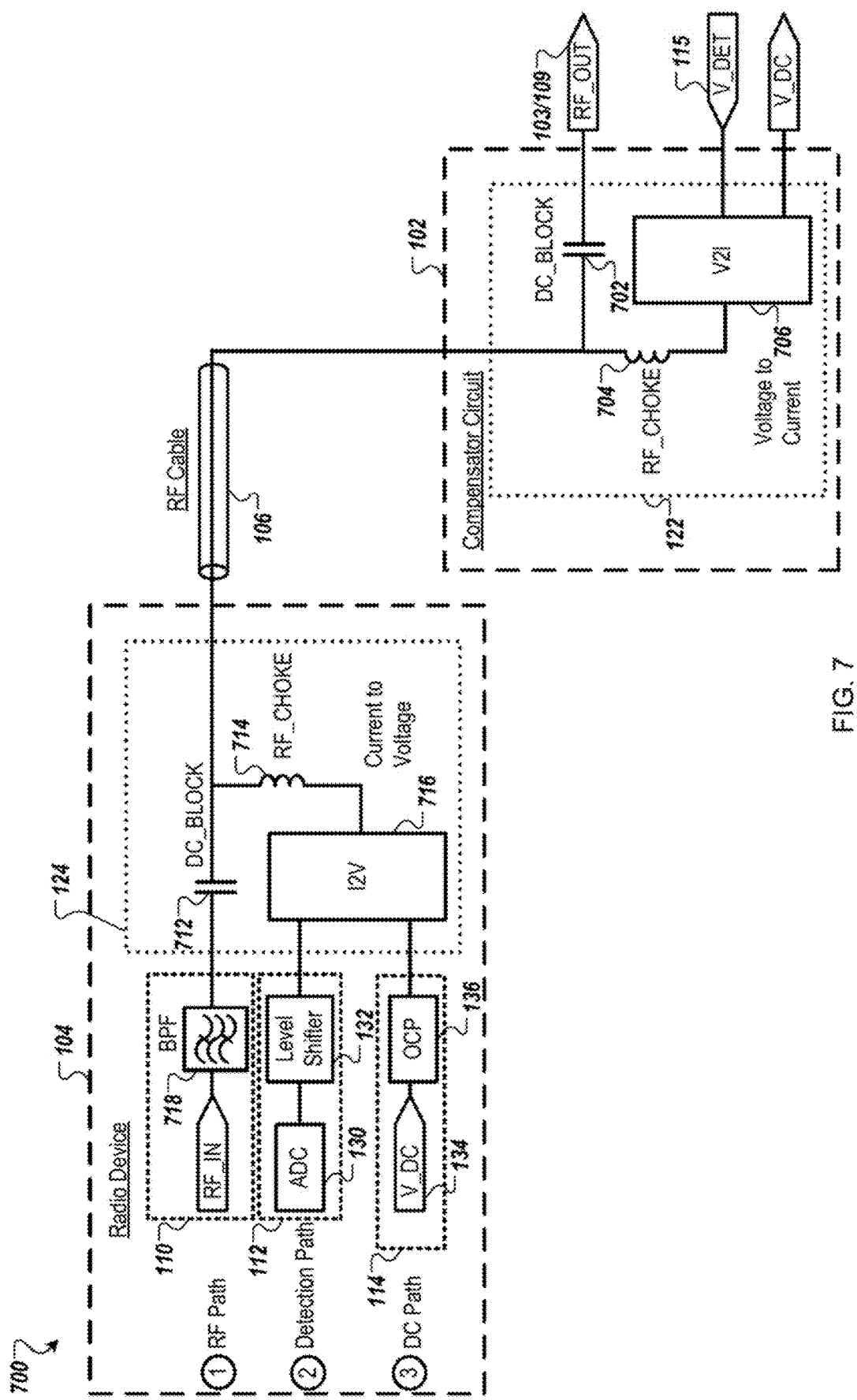
FIG. 7 is a schematic diagram of a first triplexer and a second triplexer of a communication device with a cable-loss compensator system according to one embodiment.

FIG. 7 is a schematic diagram of a first triplexer 122 and a second triplexer 124 of a communication device 700 with a cable-loss compensator system according to one embodiment. Although not all components of the communication device 700 are shown, the communication device 700 is the same or similar as the communication device 100 of FIG. 1 as noted by similar reference numbers. RF signals, RF power detection signals (V_DET), and DC signals are multiplexed over the RF cable 106 between the radio device 104 and the compensator circuit 102. Each signal is isolated at the compensator circuit 102 by the first triplexer 122 and at the radio device 104 by the second triplexer 124. This prevents RF signal degradation, unwanted DC current flow, and RF detection signal distortion.

The first triplexer 122 includes a first bias tee (e.g., a diplexer) that includes a DC blocking capacitor 702 and an RF choking inductor 704. A voltage-to-current (V2I) converter circuit 706 is coupled to the RF choking inductor 704. The DC blocking capacitor 702 is coupled to an RF output (RF_OUT) of the first triplexer 122. The RF output outputs the first RF signal 103 in a TX mode or receives the second RF signal 109 in an RX mode. In the TX mode, the first RF signal 103 is fed to the directional coupler 138 (not shown in FIG. 7) that sends the first RF signal 103 to the FEM circuit 116 and the first copy 103a of the first RF signal to the FEM control circuit 118 that generates the first DC detection voltage signal 115. The V2I converter circuit 706 is coupled to the FEM control circuit 118 and receives the first DC detection voltage signal 115 from the FEM control circuit 118. The V2I converter circuit 706 converts the first DC detection voltage signal 115 to a current for transmission over the RF cable 106 to the detection path 112. The V2I converter circuit 706 is further coupled to the power supply circuit 120 and inputs the DC power signal from the DC path 114 to the power supply circuit 120.

The second triplexer 124 includes a second bias tee that includes a DC blocking capacitor 712 and an RF choking inductor 714. A current-to-voltage (I2V) converter circuit 716 is coupled to the RF choking inductor 704. The DC blocking capacitor 712 is coupled to the radio 126 (not shown in FIG. 7) via circuitry such as the RFFE circuitry 128 (not shown in FIG. 7), which can include components such as BPFs. The I2V converter circuit 716 is coupled to the ADC 130 and the level shifter 132. The I2V converter circuit 716 receives the first DC detection voltage signal 115 as a current via the RF cable 106. The I2V 716 circuit converts the first DC detection voltage signal 115 back to a voltage for the ADC 130. The I2V converter circuit 716 is further coupled to the DC power source 134 and the OCP circuitry 136 and sends a DC power signal over the RF cable 106 to the first triplexer 122.

A bias tee such as the first bias tee or the second bias tee isolates an RF signal (e.g., the first RF signal 103 or the second RF signal 109) from the DC power signal. An impedance mismatch of a path of the RF signal can be minimized by the RF choking inductor with a self-resonant frequency (e.g., a high RF impedance) in the band or frequency range of interest. Out-of-band signals, including the first DC detection voltage signal are filtered out of the RF path by a BPF 718. The BPF 718 can be a discrete component or it can be part of the RFFE circuitry 128. The values of the DC blocking capacitors and the RF choking inductors in the bias tees can affect tuning, impedance matching, or the like, thus the values should be chosen based on a desired operation frequency (such as 2.4 GHz, 5 GHz, or the like). The RF choking inductors can be considered as narrow band filters to block RF signals from contaminating DC signals.

The first DC detection voltage signal (V_DET or RF detection voltage) is converted to a current and summed with a DC current by the V2I converter circuit 706. This buffers the output impedance of the RF detection circuit 504b of FIG. 5B and takes advantage of the ability of the DC power source 134 to continuously adjust the supplied current based on demand. The first DC detection voltage after the V2I converter circuit 706 is a low frequency current signal and is converted back to a voltage by the I2V converter circuit 716. The level shifter 132 can be used to keep the voltage of the first DC detection voltage signal within the dynamic range of the ADC 130.

In the I2V converter circuit 716, the DC power source 134 generates a DC current which is summed with the low frequency current signal (e.g., the first DC detection voltage as a current). This approach can be used since the DC power supply operates in a constant voltage mode. Current flow between the DC power source 134 and the ADC 130 can be prevented by a high input impedance detection path and a reverse current protection within the I2V converter circuit 716.

Figure 8:
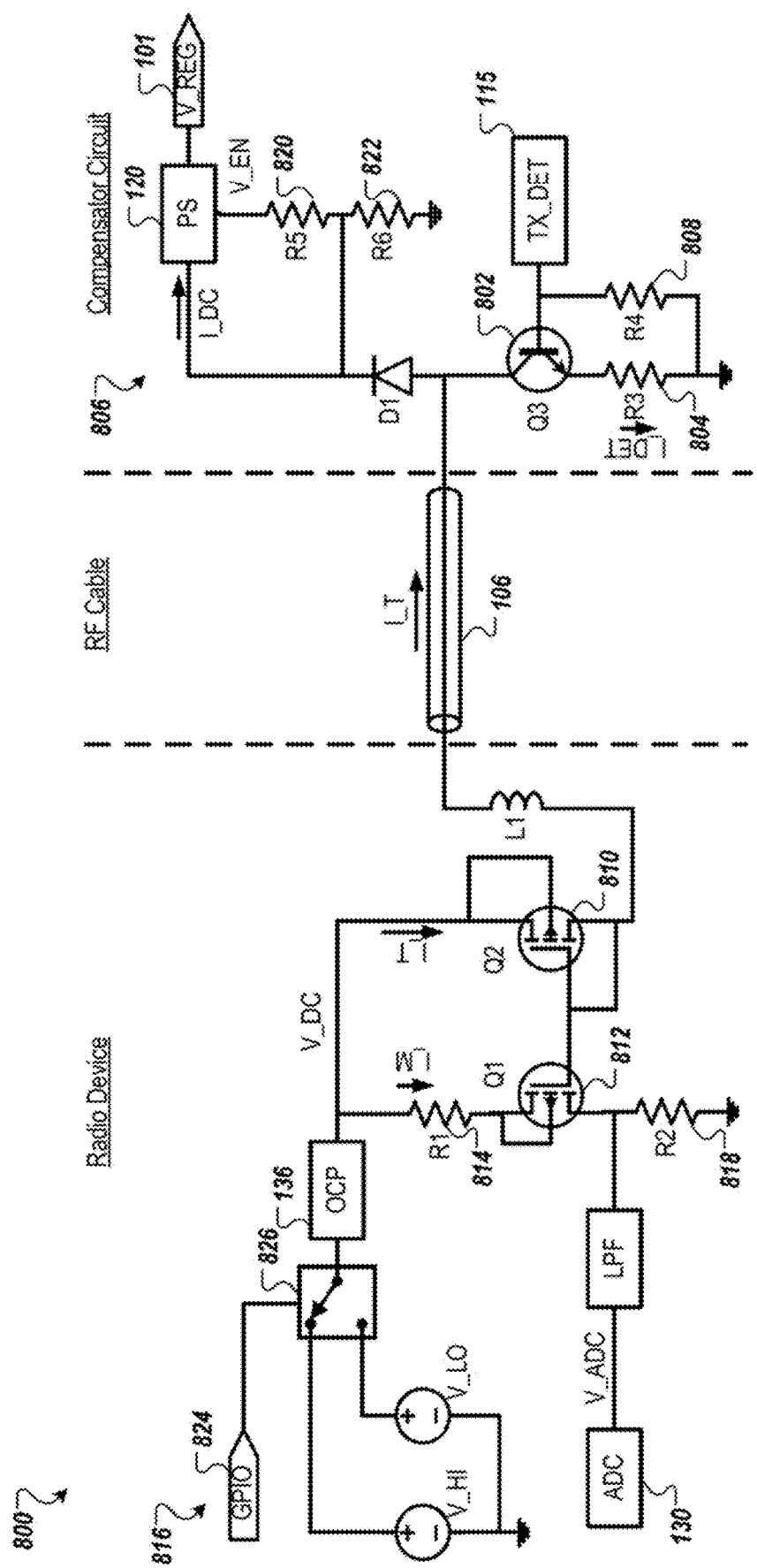
FIG. 8 is a schematic diagram of a voltage-to-current (V2I) converter circuit and a current-to-voltage (I2V) converter circuit of a communication device with a cable-loss compensator system according to one embodiment.

FIG. 8 is a schematic diagram of a V2I circuit 806 and an I2V circuit 816 of a communication device 800 with a cable-loss compensator system according to one embodiment. Although not all components of the communication device 800 are shown, the communication device 800 is the same or similar as the communication device 100 of FIG. 1 as noted by similar reference numbers. The V2I circuit 806 and the I2V circuit 816 are the same or similar to the V2I converter circuit 706 and the I2V 716 of FIG. 7. The V2I circuit 806 and the I2V circuit 816 are based on current mirroring. The V2I circuit 806 receives the first DC detection voltage signal 115 at a TX detection pin of the V2I circuit 806. The first DC detection voltage signal 115 is converted to a voltage and applied to the base of a transistor 802. The current drawn by the transistor 802 increases as the voltage of the first DC detection voltage signal 115 increases. The voltage at the transistor 802 is fixed, and the current drawn by the transistor 802 can be limited by an emitter resistor 804. A base capacitance of the transistor 802 can be kept low (e.g., less than 1 pF) to avoid slowing down the timing of detection of the first DC detection voltage signal 115. A shunt resistor 808 can be used to set the input impedance of the V2I circuit 806.

The current (I_DET) that flows through the transistor 802 can be summed with the current (I_DC) that flows through voltage regulator of the power supply circuit 120. The summed current (I_T=I_DET+I_DC) flows through a transistor 810, which can be a FET that can support a high current (e.g., of 1 amp or more). The summed current (I_T) is mirrored (I M) by a transistor 812 that is configured as a source follower. A resistor 814 and a resistor 818 set the current that flows through the transistor 812 as well as a voltage range. Therefore, the current mirroring in the I2V circuit 816 both converts current to voltage and performs level shifting.

In one embodiment, the transistor 802 is a negative-positive-negative (NPN) bipolar junction transistor (BJT) and the transistor 810 and the transistor 812 are p-channel metal-oxide-semiconductor FETs (MOSFET) (PMOS). In other embodiments, with some modifications to the V2I circuit 806 and the I2V circuit 816, the transistor 802, the transistor 810, and the transistor 812 can be other types of transistors, such as a positive-negative-positive (PNP) BJT, a field effect transistor (FET), an n-channel MOSFET (NMOS), or the like.

In one embodiment, the V2I converter circuit 806 includes the transistor 802 that receives the first RF signal as a voltage at a base terminal of the transistor 802. A current of the transistor can be limited by the resistor 804. The resistor 808 sets an input impedance of the V2I converter circuit 806 and converts the first RF signal to the current signal.

A detection signal, such as the first DC detection voltage signal 115, can be difficult to measure when the voltage regulator of the power supply circuit 120 is enabled, due to the PA 302 (shown in FIG. 3) sinking a much larger current (I_DC≈1 A) than the detection signal (I_DET 10 mA). This can lead to difficult in achieving the correct voltage scaling at the current mirror output on the radio device 104. To mitigate this, at the DC power source, a lower supply voltage (V_LO) can be used to disable the voltage regulator (e.g., cause to power supply circuit 120 to stop generating the regulated voltage 101) during an RF detection measurement period for detecting the detection signal. This can be achieved by using a voltage divider, including a resistor 820 and a resistor 822, to set V_EN to a logic low state when the DC power signal is set to the low voltage (V_DC=V_LO). The low voltage can be selected by general purpose input/output (GPIO) pin 824 selecting the lower voltage using a switch 826. In normal operation (e.g., when the detection signal is not being detected), the GPIO pin 824 can toggle the switch 826 to select a higher voltage. In one embodiment, the low voltage is 5V and the high voltage is 12V. In other embodiments, different voltage values can be selected for the low voltage and the high voltage. In normal operation the small detection signal current has no effective impact on the RF amplifier performance and is filtered out by regulator circuitry.

Figure 9A:
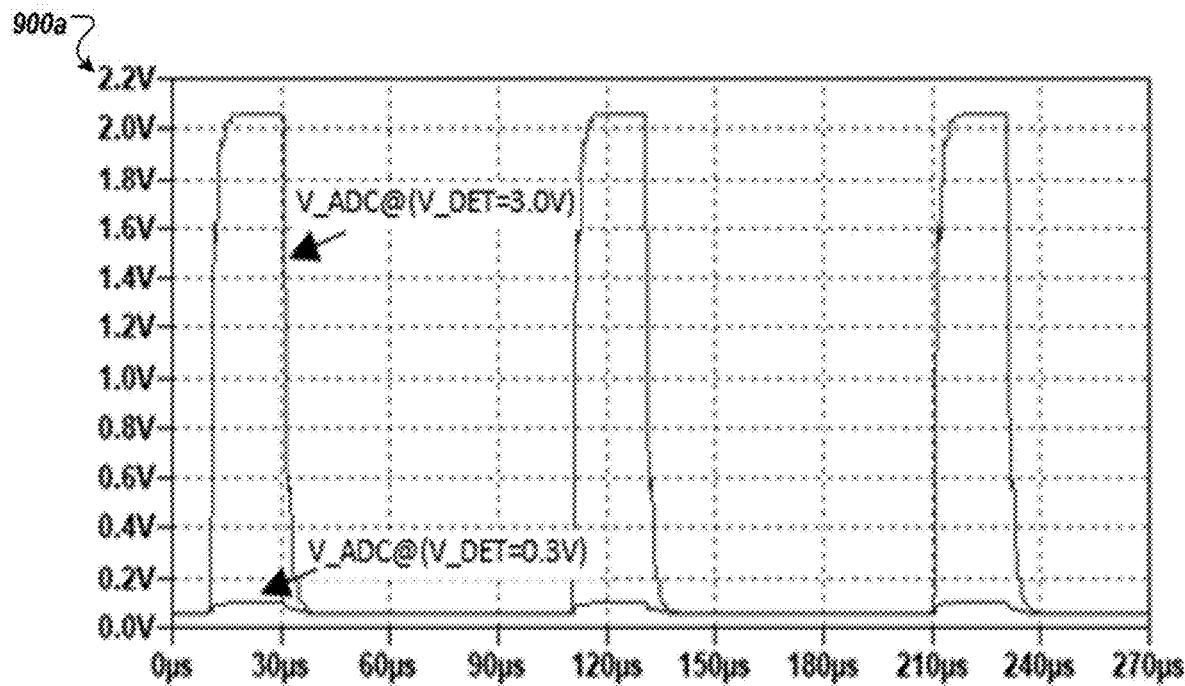
FIG. 9A is a graph that shows a current mirror response in a signal detection mode according to one embodiment.

FIG. 9A is a graph 900*a* that shows a current mirror response in a signal detection mode according to one embodiment. As described with respect to FIG. 8, in the signal detection mode, the DC power signal is set to the low voltage value. The graph 900*a* shows an efficient transfer of the detection signal (the first DC detection voltage signal 115) over the RF cable 106 during the detection measurement period. As shown, a detection signal of 0.3V produces a voltage of 0.1V at the ADC input and a detection signal of 3V produces a voltage of 2V at the ADC input when the DC power signal is set to the low voltage value (e.g., 5V). Current mirror and RF cable impedances on the radio device 104 slow down the rising and falling edges of the detection signal. In on embodiment a sampling of at least 100 kHz over multiple detection periods can result in accurate estimates on the detection voltage range. The detection voltage range can be mapped to RF power levels by a pre-calibrated lookup table.

Figure 9B:
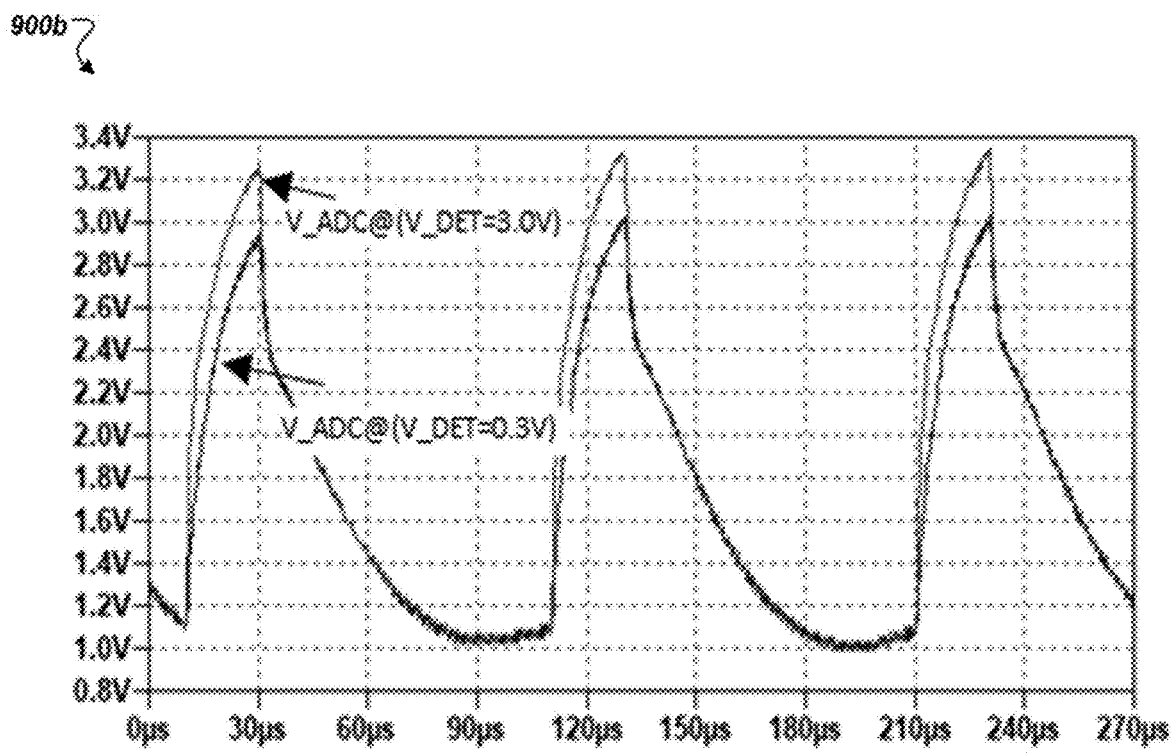
FIG. 9B is a graph that shows the impact of enabling the voltage regulator of the power supply circuit during the detection measurement period according to one embodiment.

FIG. 9B is a graph 900*b* that shows the impact of enabling the voltage regulator of the power supply circuit 120 during the detection measurement period according to one embodiment. In this case, the voltage regulator is enabled and the DC power signal is set to the high voltage value during the detection measurement period. An increased current draw from the PA 302 (shown in FIG. 3) and excessive voltage regulator switching noise can reduce the dynamic range of the detection signal at the ADC input from 2V to 0.3V.

Figure 10A:
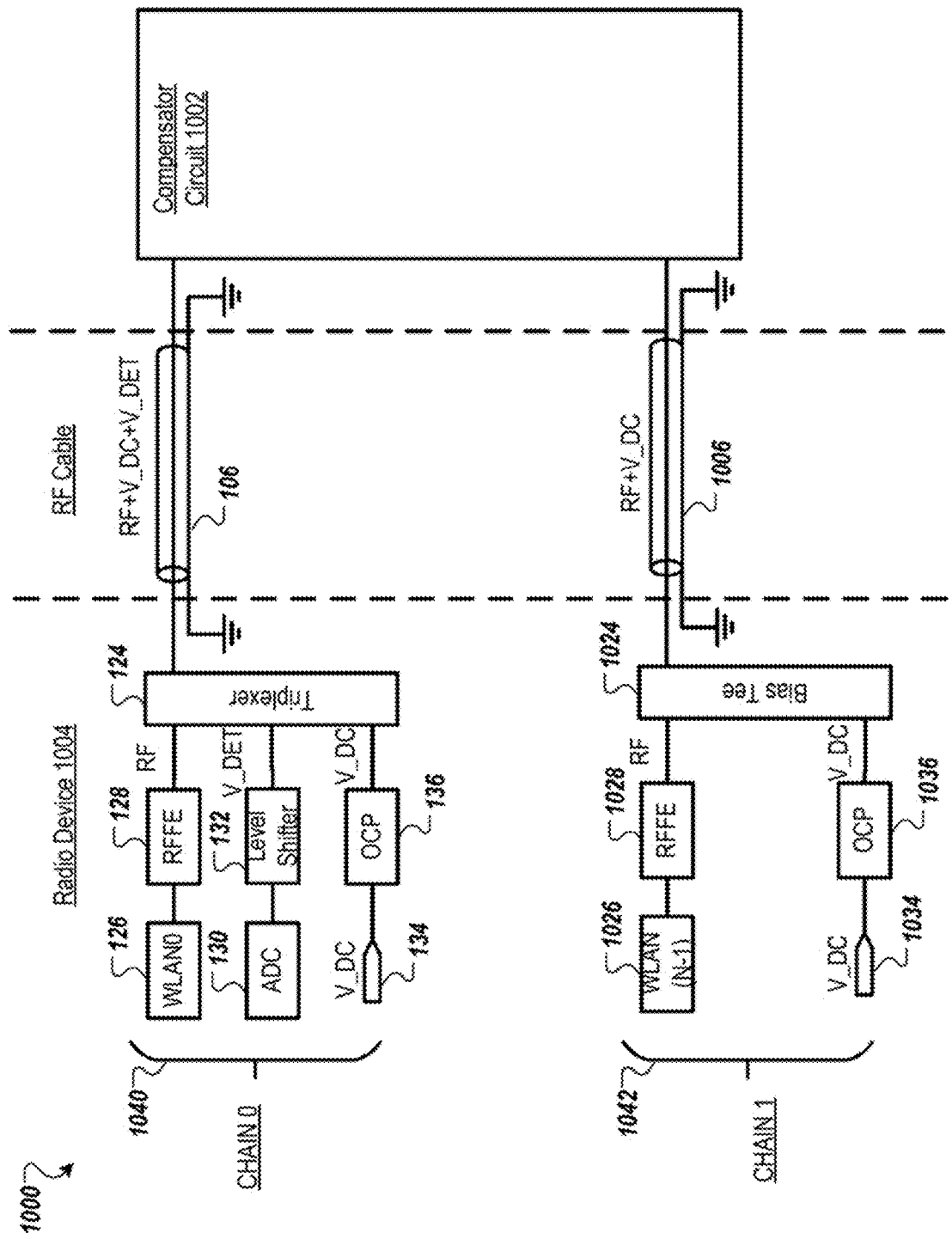
FIG. 10A is a schematic diagram of a multiple-input-multiple-output (MIMO) communication device with a cable-loss compensator system according to one embodiment.

FIG. 10A is a schematic diagram of a multiple-input-multiple-output (MIMO) communication device 1000 with a cable-loss compensator system according to one embodiment. Although not all components of the communication device 1000 are shown, portions of the communication device 1000 are the same or similar as the communication device 100 of FIG. 1 as noted by similar reference numbers. Many Wi-Fi and other wireless communication devices support MIMO communication. The number of RF chains is equal to the MIMO order of the system (e.g., a 2×2 MIMO system requires two RF chains). The cable-loss compensator system described herein can be generalized for a MIMO communication system.

In the depicted embodiment, the MIMO communication device 1000 includes a first RF chain 1040 and a second RF chain 1042. The first RF chain 1040 and the second RF chain 1042 can be coupled to the FEM control circuit and power supply circuit. The first RF chain 1040 is the same as the radio device 104. The second RF chain 1042 is connected to the same FEM control circuit as the first RF chain 1040 and does not include an ADC or a level shifter. The second RF chain 1042 includes a second RF path that includes a radio 1026, an RFFE circuit 1028 connected to a bias tee 1024. The second RF chain 1042 includes a DC path that includes a second DC power source 1034 coupled to an OCP 1036 and is coupled to the bias tee 1024. The DC power source 134 and the second DC power source 1034 can be connect the same power supply as described below. The bias tee 1024 in the second RF chain 1042 takes the place of the second triplexer 124 in the first RF chain 1040. Because the first RF chain 1040 and the second RF chain 1042 are connected to the same FEM control circuit, a detection signal (e.g., TX detection signal such as the first DC detection voltage signal 115) only needs to be processed by the first RF chain 1040 and the second RF chain 1042 does not need to have an I2V circuit as is included in the triplexer 124.

In other embodiments the first RF chain can be coupled via the RF cable to the FEM control circuit and the second RF chain can be coupled via a second RF cable to a second FEM control circuit. In such a case, the second RF chain would be identical to the first RF chain and include an ADC, a level shifter, and a triplexer in place of the bias tee 1024.

The DC power source 134 and the second DC power source 1034 can be inputs for DC power and be supplied by a single power supply in order to distribute DC current loads over multiple RF cables, for example to provide power to the power supply circuit on the compensator circuit. RF cables, such as the RF cable 106 and the RF cable 1006, experience loss, such as copper loss or I$^2$R loss, through processes such as Joule heating that increase (as current squared) with increasing current. Such losses can be mitigated by distributing the DC current onto more than one RF cable. The first RF chain 1040 is coupled to the compensator circuit 1002 by the RF cable 106. The second RF chain 1042 is coupled to the compensator circuit 1002 by the RF cable 1006. The MIMO system with the cable-loss compensation system can save on cost and be suitable for applications where both MIMO chains experience similar RF conditions. In some cases, for higher order MIMO, dedicated circuitry (e.g., FEM control circuitry, triplexers, and the like) for each chain can be desirable, especially for sectorized directional antennas. In the depicted embodiment, however, one antenna can receive a strong RX signal and trigger a bypass (e.g., an LNA bypass) independently without impacting of affecting the other chains.

Figure 10B:
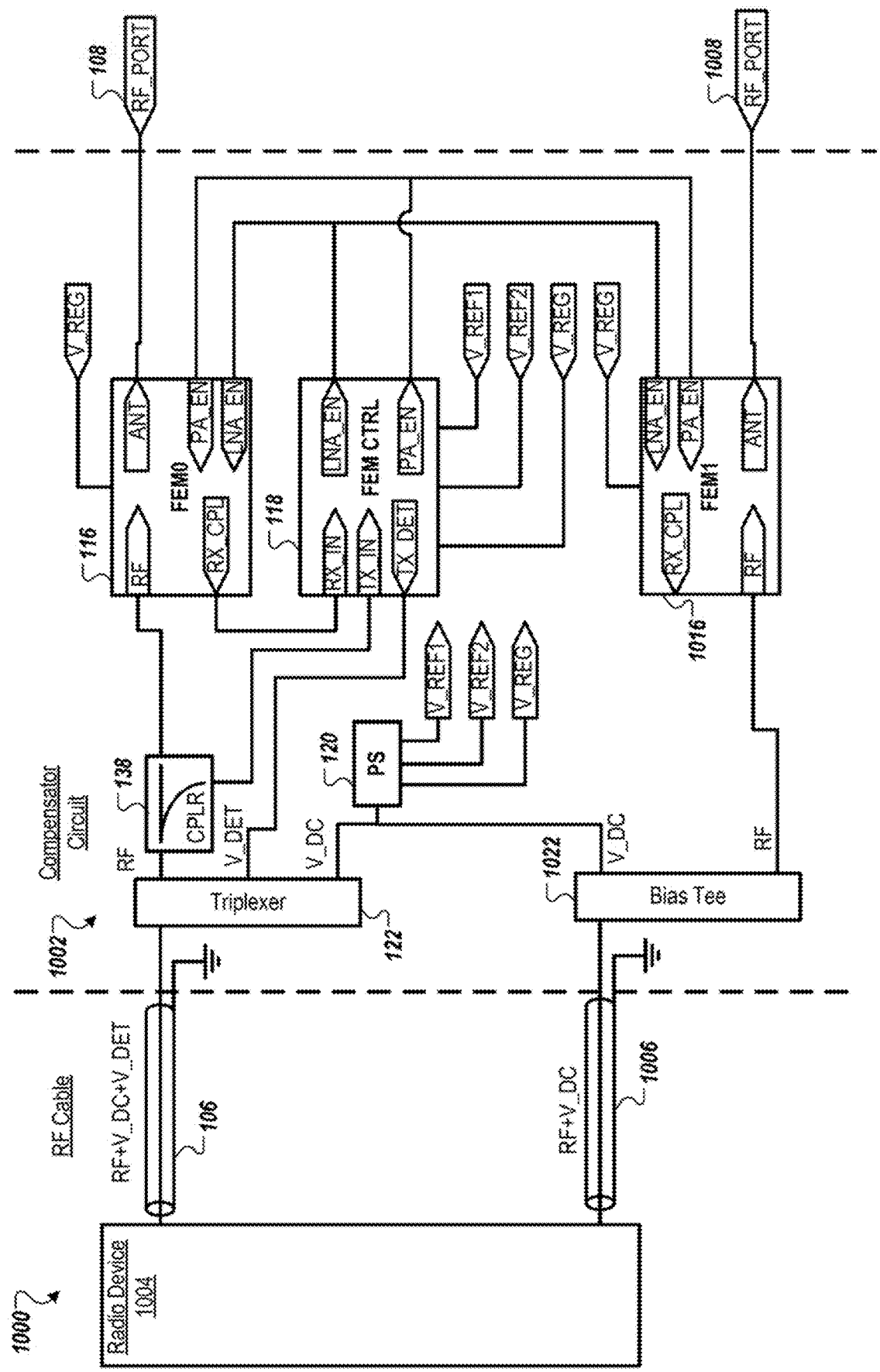
FIG. 10B is a schematic diagram of a compensator circuit 1002 of a MIMO communication device with a cable-loss compensator system according to one embodiment.

FIG. 10B is a schematic diagram of a compensator circuit 1002 of a multiple-input multiple-output (MIMO) communication device 1000 with a cable-loss compensator system according to one embodiment. Although not all components of the communication device 1000 are shown, portions of the communication device 1000 are the same or similar as the communication device 100 of FIG. 1 as noted by similar reference numbers. In the depicted embodiment, the compensation circuit includes a third port 1008 to couple to the second RF cable 1006 and a fourth port to couple a second antenna. The power supply circuit 120 receives a first DC power signal from the DC power source 134 and the second DC power source 1034. The power supply circuit 120 generates a regulated voltage, a first reference voltage and a second reference voltage. The regulated voltage powers the FEM circuit 116, the FEM circuit 1016, and the FEM control circuit 118. In the depicted embodiment, the first enable signal and the second enable signal control both the PA_EN of the first FEM circuit 116 and the PA_EN of the second FEM circuit 1016 and the LNA_EN of the first FEM circuit 116 and the LNA_EN of the second FEM circuit 1016. The first FEM circuit 116 and the second FEM circuit 1016 are controlled the same first enable signal and the second enable signal. In other embodiments the FEM control circuit generates different control signals for the first FEM circuit 116 and the second control circuit, in which case, the FEM control circuit generates a first enable signal to enable the PA of the first FEM circuit and a second enable signal to enable the LNA of the first FEM circuit 116 as well as a third enable signal to enable the PA of the second FEM circuit and a fourth enable signal to enable the LNA of the second FEM circuit. A diplexer 1022 (e.g., a bias tee) is coupled to the third port, and in a TX mode the diplexer 1022 receives a third RF signal and the second DC power signal over the second RF cable 1006. The diplexer 1022 isolates the third RF signal and the second DC power signal. In an RX mode the diplexer 1022 sends a fourth RF signal to the radio device 1004 which includes a MIMO radio. It should be noted that in some embodiments the diplexers and the triplexers can more generally be multiplexers to multiplex between one signal and two signals (e.g., such as a DC power signal and an RF signal), one signal and three signals (e.g., such as a DC power signal, an RF signal, and a voltage detection signal), one signal and four signals, and the like.

In other embodiments, the communication device 1000 can be a higher order MIMO system with the cable loss compensator system with additional radios and/or antennas, such as with three radios and three antennas coupled by three RF cables, or four radios and four antennas coupled by four RF cables, or another number of radios and antennas.

Figure 11:
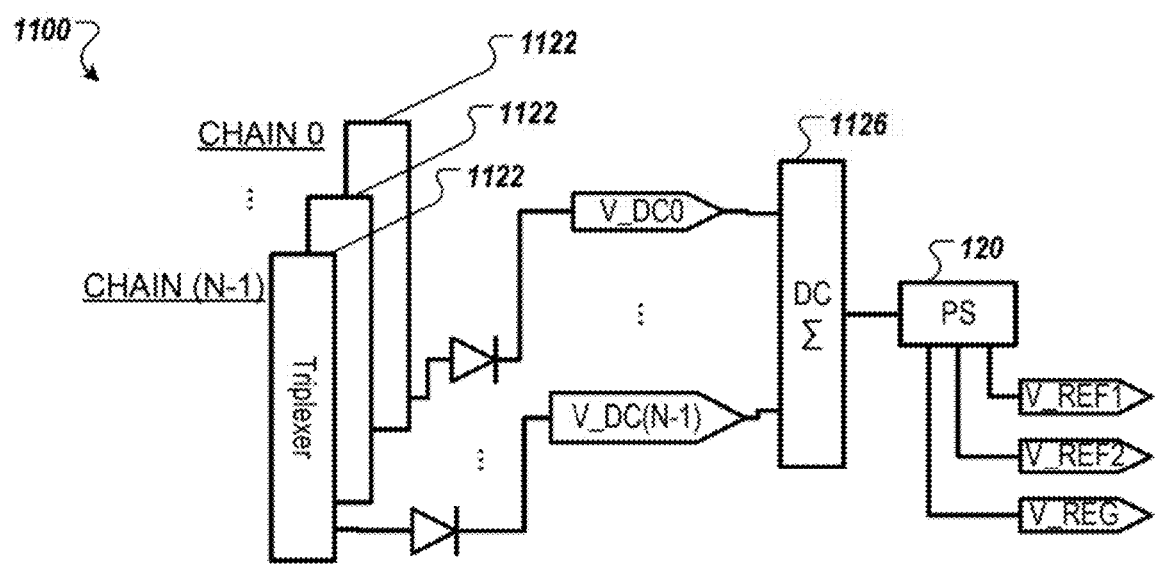
FIG. 11 is a schematic diagram of a compensator circuit of a MIMO communication device with a cable-loss compensator system according to one embodiment.

FIG. 11 is a schematic diagram of a compensator circuit 1102 of a MIMO communication device 1100 with a cable-loss compensator system according to one embodiment. Although not all components of the communication device 1100 are shown, portions of the communication device 1100 are the same or similar as the communication device 100 of FIG. 1 and the communication device 1000 of FIG. 10 as noted by similar reference numbers. The communication device 1100 includes a set of triplexers 1122 to multiplex one or more signals from the radio device. In the depicted embodiment, each triplexer 1122 receives at least a DC power via corresponding RF cables. A single power supply can aggregate its current and distribute it over multiple RF cables to reduce power dissipation (e.g., I²R) and voltage drop. In such a case, each triplexer 1122 receives a DC power signal over an RF cable and feeds the DC power signal to a DC summation circuit 1126. The DC summation circuit 1126 sums each of the DC power signals and provides a total DC power signal to the power supply circuit 120. The power supply circuit generates a regulated voltage, a first reference voltage, and a second reference voltage. Each triplexer can be coupled to a FEM control circuit and a FEM circuit (not shown in FIG. 11). The regulated voltage can be each FEM control circuit and each FEM circuit. In other embodiments, each triplexer 1122 can be coupled to a corresponding FEM circuit and a single FEM control circuit.

Figure 12:
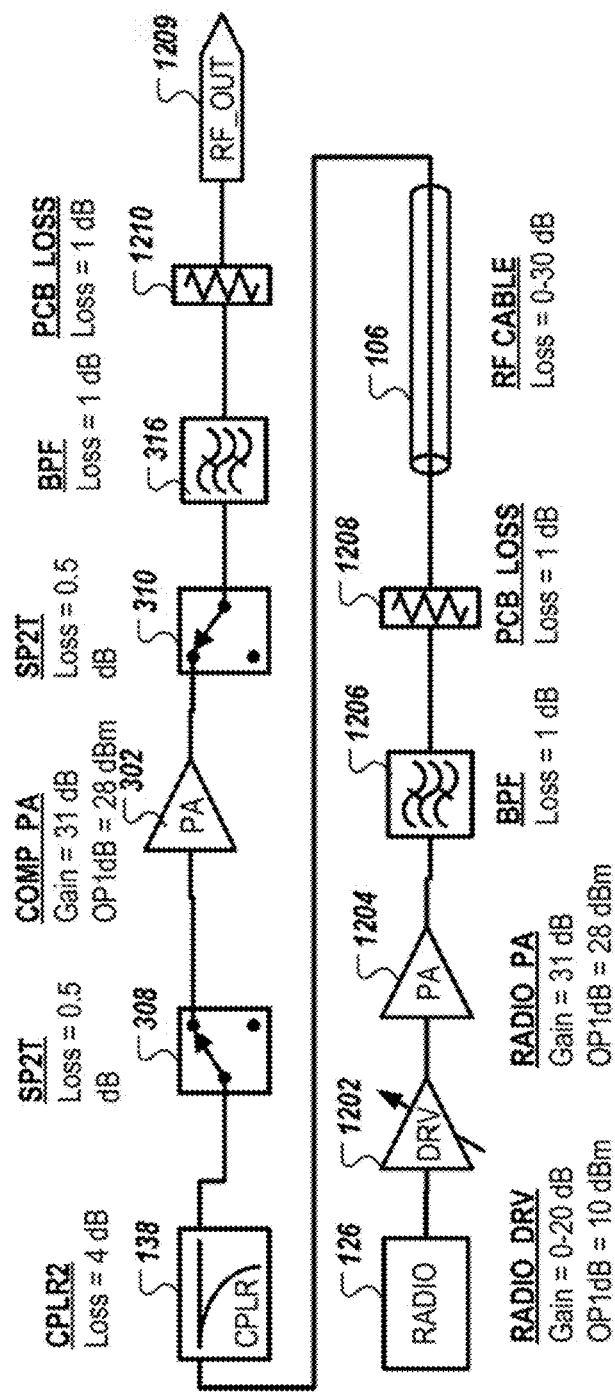
FIG. 12 is a schematic diagram of an RF system budget of a transmit (TX) chain of a communication device with a cable-loss compensator system according to one embodiment.

FIG. 12 is a schematic diagram of an RF system budget of a TX chain of a communication device 1200 with a cable-loss compensator system according to one embodiment. Although not all components of the communication device 1200 are shown, the communication device 1200 is the same or similar as the communication device 100 of FIG. 1 as noted by similar reference numbers. Each component of the communication device has a loss including losses from the circuit board (e.g., a printed circuit board (PCB) itself). The communication device 1200 includes a radio 126 coupled to an amplifier 1202. The amplifier 1202 can be a driver amplifier or other type of amplifier that is used to adjust the input level of the first RF signal to the detector to adjust both sensitivity and timing. The amplifier 1202 is coupled to a PA 1204 on the radio device. The PA 1204 is coupled to a BPF 1206 which is coupled to the RF cable 106. The radio sends the first RF signal (e.g., a TX signal) via a triplexer (not shown in FIG. 12) over the RF cable to the directional coupler 138 on the compensator circuit. When a FEM control circuit determines that the first RF signal is a TX signal, switches 308 and 310 are configured to route the first RF signal though the PA 302 that is coupled between the switches 308 and 310. The switches 308 and 310 can be 2 terminal switches. A BPF 316 is coupled between the switch 310 and an RF port 1209. The RF port can be coupled to an antenna or other RF output. Each of the components in FIG. 12 indicates a loss or gain associated with the component. Further there are PCB losses that can be due to resistive heating losses that are effectively represented by resistors 1208 and 1210.

A TX dynamic range can be defined by a range of transmittable signals up to the linearity limit of the TX chain of the communication device 1200. The minimum TX power can be limited by the minimum detectable signal (MDS) of approximately −15 dBm at the TX detector. The high end of the TX dynamic range can be limited by the linearity of the PA which can impact the error vector magnitude of the modulated signal. The maximum input power to the PA input is −8 dBm when the communication device 1200 operates with a sufficiently low EVM for a high modulation and coding scheme (MCS) communication (e.g., Wi-Fi MCS7 or greater). At this particular PA drive level, the RF power as measured at the input of the first RF signal (TX_DET) is approximately −7.5 dBm, and therefore the maximum achievable dynamic range is approximately 7 to 8 dB without any additional gain control in the compensator TX chain.

Figure 13:
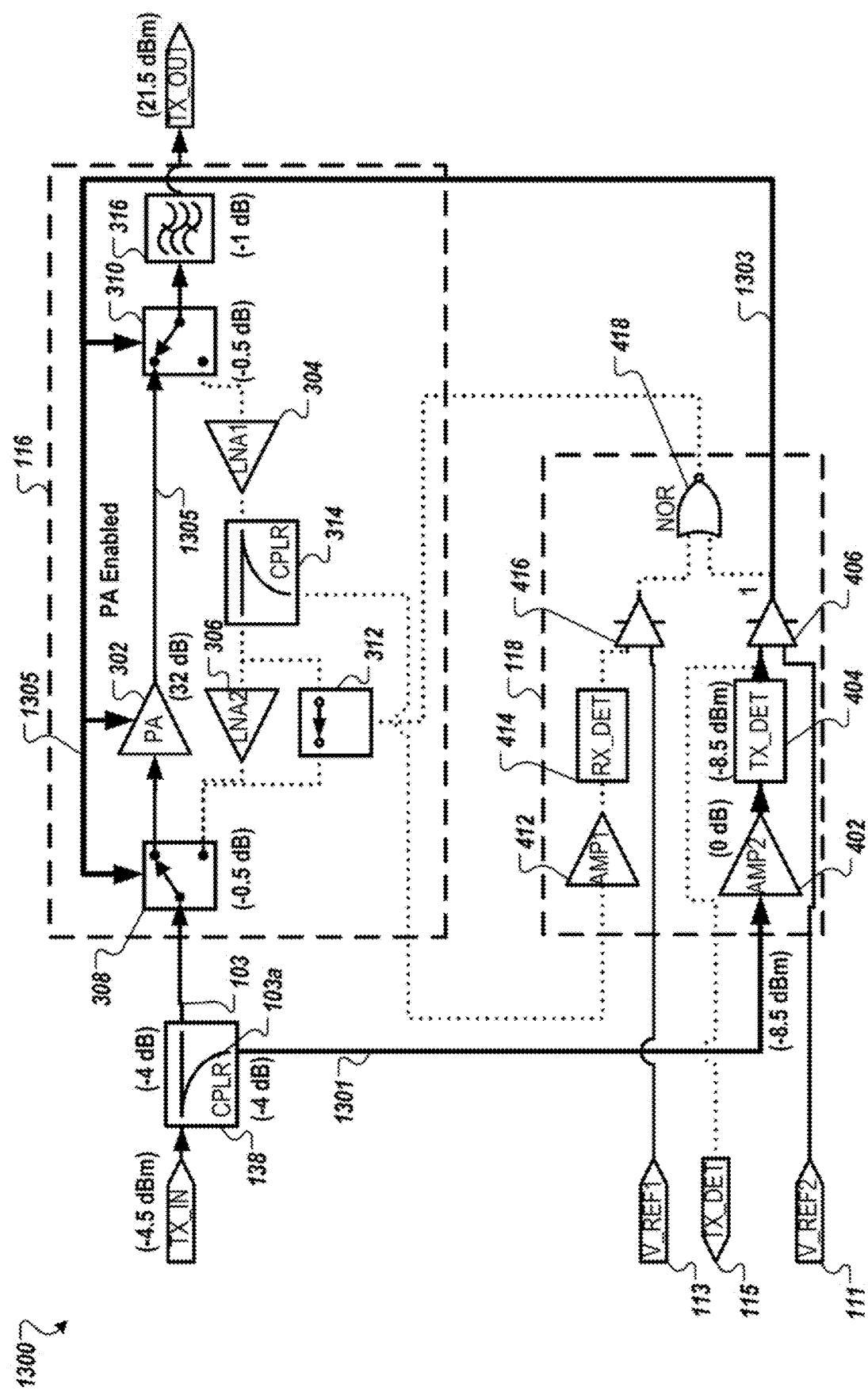
FIG. 13 is a schematic diagram of compensator circuit of a communication device with a cable-loss compensator system according to one embodiment.

FIG. 13 is a schematic diagram of compensator circuit 102 of a communication device 1300 with a cable-loss compensator system according to one embodiment. Although not all components of the communication device 1300 are shown, the communication device 1300 is the same or similar as the communication device 100 of FIG. 1 as noted by similar reference numbers. The FEM circuit 116 is the same as the FEM circuit 116 as described with respect to FIG. 3 and the FEM control circuit 118 is the same as the FEM control circuit 118 as described with respect to FIG. 4. In FIG. 13, the communication device 1300 is operating in a TX mode.

When the compensator circuit 102 receives a first RF signal 103 (TX_IN), a directional coupler 138 makes a first copy 103a of the first RF signal (e.g., the first copy 103a). The first copy 103a is routed down path 1301 to the first amplifier 402, the TX detection circuit 404, and the first comparator 406. The first amplifier can server to bring the first copy 103a into a detector range of the TX detection circuit 404. As discussed with respect to FIG. 5, the TX detection circuit 404 outputs the first DC detection voltage signal 115, as a first input to the first comparator 406. A second input to the first comparator is the first reference voltage 111 from the power supply circuit. In the cases when the first RF signal is sufficiently strong, the output of the first comparator is high, and the first copy 103 is routed to path 1303. On the path 1303, the first copy 103a flips the first switch 308 and the second switch 310 to their first terminals in order to route the path of the first RF signal 103 on a path 1305. The first copy 103a also enables the PA 302 on the path 1305. The first RF signal is routed on the path 1305 through a BPF 316 and is output to an antenna coupled to the RF port (TX_OUT).

In other embodiments, the output of the first comparator can be low in order to enable the PA 302 and to toggle the switches 308 and 310 to route the first RF signal 103 to the path 1305. Also in other embodiments, the RF port (TX_OUT) can be coupled to an RF output (such as an additional RF cable) rather than to an antenna, and the additional RF cable to can connected to additional circuitry and/or to an antenna.

Figure 14:
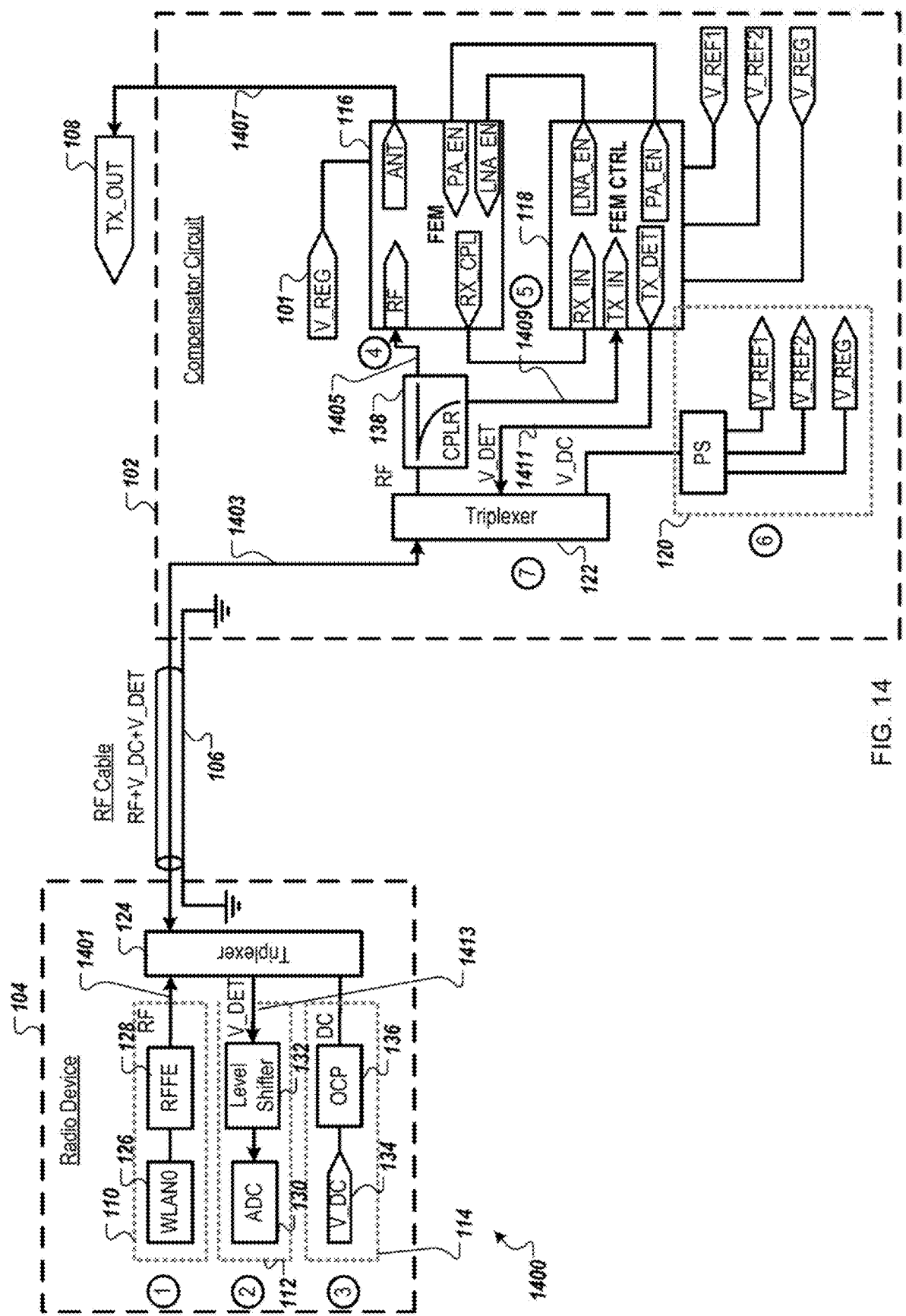
FIG. 14 is a schematic diagram of TX gain control path of a communication device with a cable-loss compensator system according to one embodiment.

FIG. 14 is a schematic diagram of TX gain control path of a communication device 1400 with a cable-loss compensator system according to one embodiment. Although not all components of the communication device 1400 are shown, the communication device 1400 is the same or similar as the communication device 100 of FIG. 1 as noted by similar reference numbers. An RF detection path to detect the first DC detection voltage signal 115 enables a measurement of a transmit power of the radio 126 at the input of the PA 302 of the compensator circuit 102. Paths 1401-1413 show a roundtrip path of the first RF signal 103 and the first copy 103a of the first RF signal as the first copy 103a is converted from an RF signal to a DC signal (e.g., a low frequency pulse) at the compensator circuit 102 and measured at the ADC 130 of the radio device 104. The RF detection paths 1401-1413 further enable an assessment of a condition of the RF cable 106 in real time and over various frequencies. In some cases, an additional calibration step can be added to generate a table such as a lookup table for cable loss as a function of detection voltage of the first DC detection voltage signal 115.

The radio 126 generates the first RF signal 103 which is multiplexed at the second triplexer 124 and transmitted to the first triplexer 122 via the RF cable 106. The first RF signal 103 is fed through a directional coupler 138 and a first copy 103a of the first RF signal is fed to the TX detection circuit 404 of the FEM control circuit 118 which converts the first copy 103a to the first DC detection voltage signal 115. The first DC detection voltage signal 115 is converted to a current signal by the first triplexer 122 and is transmitted back to the second triplexer 124 via the RF cable 106. The second triplexer 124 converts the current signal back to the first DC detection voltage signal (e.g., a voltage signal) and sends the signal to the ADC 130 to be measured. The level shifter 132 coupled between the second triplexer 124 and the ADC 130 can shift the voltage level of the first DC detection voltage signal to be within a voltage range of the ADC 130. The ADC 130 converts the first DC detection voltage signal to a digital signal.

Figure 15:
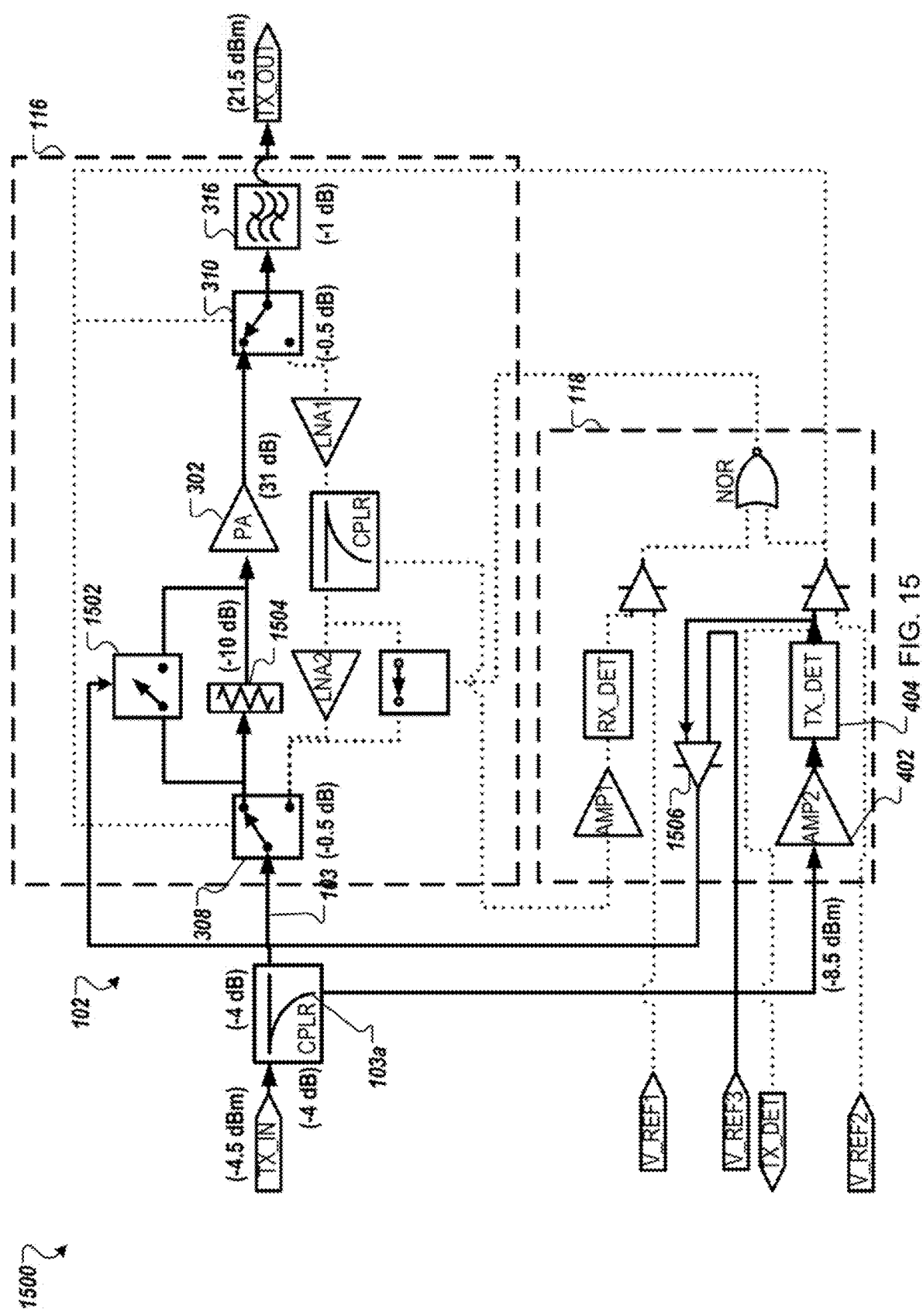
FIG. 15 is a schematic diagram of compensator circuit of a communication device with a cable-loss compensator system according to one embodiment.

FIG. 15 is a schematic diagram of compensator circuit 102 of a communication device 1500 with a cable-loss compensator system according to one embodiment. Although not all components of the communication device 1500 are shown, the communication device 1500 is the same or similar as the communication device 100 of FIG. 1 as noted by similar reference numbers. The FEM circuit 116 is the same as the FEM circuit 116 as described with respect to FIG. 3 and the FEM control circuit 118 is the same as the FEM control circuit 118 as described with respect to FIG. 4. In FIG. 15, the communication device 1500 is operating in a TX mode.

In some implementations, additional gain control can be added to the TX chain to improve the dynamic range over a wider range of cable losses of the RF cable 106. Such a step can be optional since the communication device can be tuned for specific (e.g., fixed) RF cable loss characteristics. However, if an additional gain control is to be included, in one embodiment, an attenuator 1504 can be switched into or out of the compensator circuit 102 between the switch 308 and the PA 302 by a switch 1502. In one embodiment, the attenuator 1504 can be a 10 dB attenuator, and can be switched into the compensator circuit 102 when the input to the PA 302 exceeds −8 dBm. In other embodiments, the attenuator can have a different value and can be switched into the compensator circuit 102 for other inputs to the PA 302.

In one embodiment, the power supply circuit 120 (not shown in FIG. 15) generates a third reference voltage in addition to the first reference voltage, the second reference voltage, and the regulated voltage. The third reference voltage is a first input to a comparator 1506 and the first DC detection voltage signal 115 (e.g., that is output by the TX detection circuit 404) is a second input to the comparator 1506. When the first DC detection voltage signal 115 is greater than the third reference voltage, the attenuator 1504 can be switched into the FEM circuit 116 of the compensator circuit 102.

The use of the attenuator 1504 at the input of the PA 302 can improve the compensator input TX dynamic range by as much as 10 dB. The fully dynamic range can be achieved for a given cable loss value of the RF cable 106 near 15 dB. The use of the attenuator 1504 can serve to extend a linear TX operation to short cable lengths, even to a direct connection between the radio 126 and the compensator circuit 102, which can offer flexibility for system designs. The use of the attenuator 1504 can also mitigate the potential for permanent damage to the PA when the radio is operating at a maximum TX input power.

FIG. 16 illustrates a Wi-Fi TX airframe structure 1600 according to one embodiment. In one embodiment, the TX airframe structure is an 802.11n airframe structure. In other embodiments, the TX airframe structure can be another Wi-Fi TX airframe structure. Alternatively, other airframe structures can be used. The TX airframe structure indicates training field symbols including short training field (STF) symbols and long training field (LTF) symbols followed by a signal field, a service field, a data field, and a padding field. RF detector response times can depend on the RF signal level or strength. In other words, RF detector response times are a function of RF signal levels. For example, signals near 0 dBm can lead to a DC detection voltage signal above a reference voltage within approximately 10 ns. On the other hand, lower signal amplitudes near −10 dBm may require 100 ns or more for the output of the RF detector (e.g., the TX/RX detection circuits) to exceed the corresponding reference voltages. The additional delay, also referred to as the comparator propagation delay, and a latency time to enable the PA 302 (e.g., with the PA_EN) signal can lead to a slowdown in the response time of the cable-loss compensator system. For Wi-Fi based protocols, this can be problematic due to truncation of training fields during TX.

Training field symbols can be used by a communication device receiving an RF signal to adjust parameters of the RX path, including automatic gain control (AGC). Each training field symbol can be 800 ns in length (duration), which means that a response time of the compensator circuit (e.g., between approximately 10 ns and 100 ns) can occupy a noticeable portion and lead to corruption of the first STF symbol, which can increase an error rate of the packet or airframe structure received at the receiver. Various methods can be used to mitigate the effects of the response time of the compensator circuit on the received airframe structure, as described in further detail below.

Figure 17:
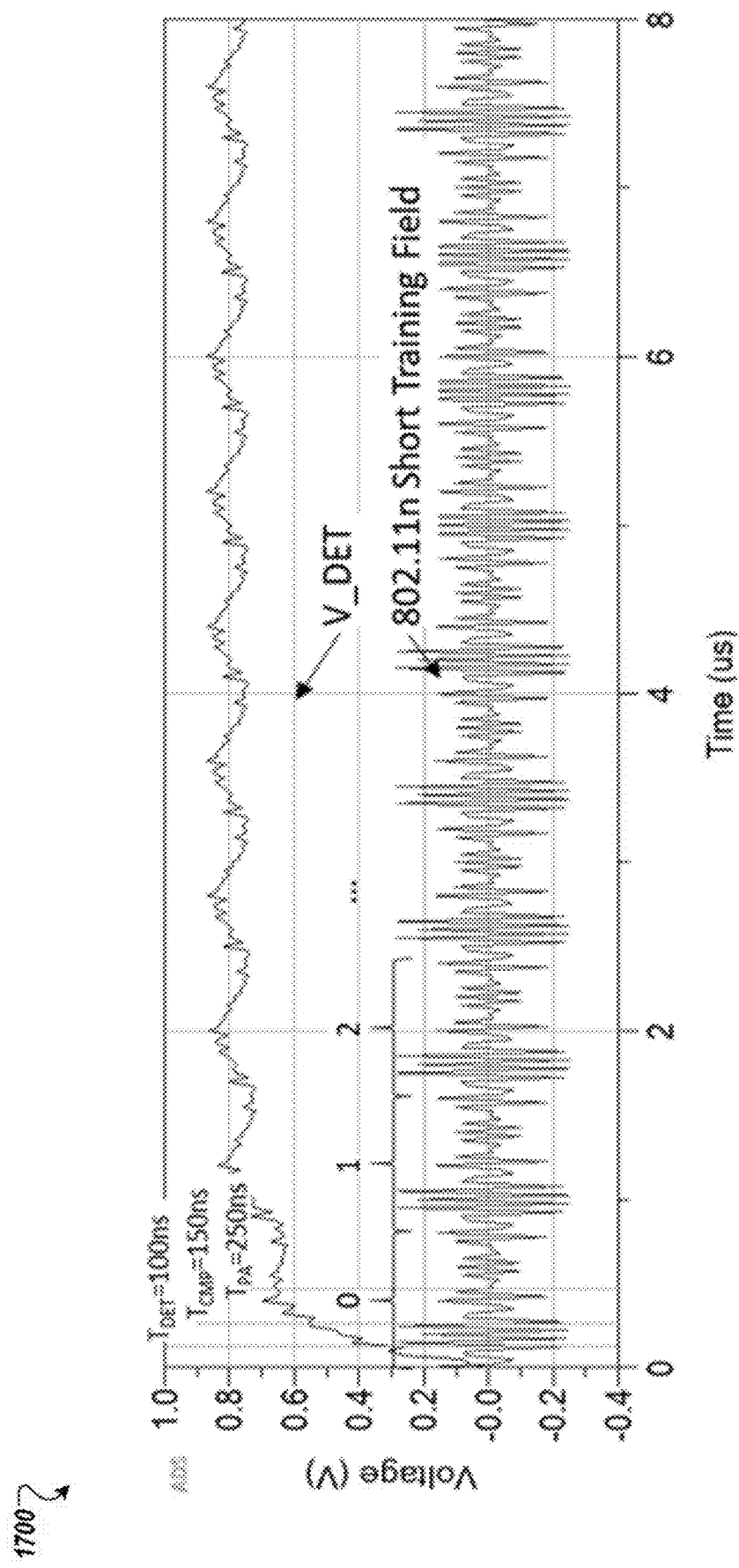
FIG. 17 is a graph that illustrates an RF detector voltage output and a short training field (STF) waveform according to one embodiment.

FIG. 17 is a graph 1700 that illustrates an RF detector voltage output and a STF waveform according to one embodiment. The graph 1700 can be an example response of a communication device, such as any of the communication devices with the cable-loss compensator system as described herein (e.g., the communication device 1000 of FIG. 1, the communication device 3000 of FIG. 3, the communication device 4000 of FIG. 4, etc.). The RF detector voltage output can be the first DC detection voltage signal that is output by the TX detection circuit, such as the TX detection circuit 404 of FIG. 4. The graph 1700 is a simulation to illustrate characteristics of the STF symbol truncation for a Wi-Fi based modulated signal. Typical response times are shown for the RF detector (e.g., $T_{DET}$=100 ns), the compensator circuit (e.g., $T_{CMP}$=150 ns), and the PA enable signal (e.g., $T_{PA}$=250 ns for the PA_EN signal). In other embodiments, the times can vary from the values shown as an illustrative example. In the current example, the PA 302 can be expected to turn at 500 ns, which is more than halfway through the first STF training symbol. This issue can be mitigated by priming the TX path of the first RF signal in the TX mode prior to data transmission.

Figure 18:
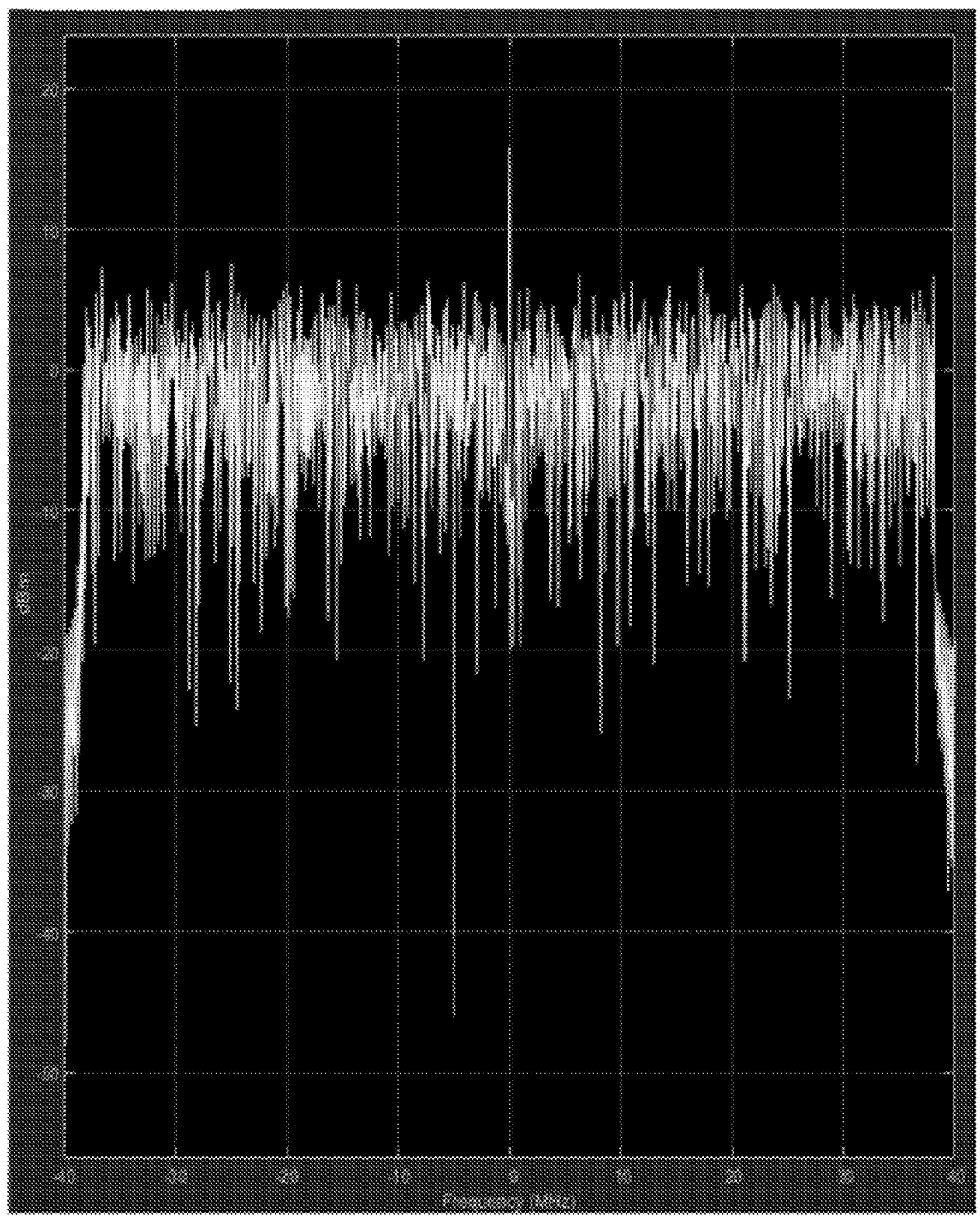
FIG. 18 is a graph of a captured spectrum of a Wi-Fi airframe structure showing local oscillator (LO) feedthrough according to one embodiment.

FIG. 18 is a graph 1800 of a captured spectrum of a Wi-Fi airframe structure showing local oscillator (LO) feedthrough according to one embodiment. In particular the captured spectrum is a captured spectrum of an 80 MHz 802.11ac frame which shows an exaggerated LO feedthrough. A first method to prime the TX path of the first RF signal in the TX mode prior to data transmission is to utilize the LO feedthrough and control the radio turn-on sequencing to prime the TX path in the compensator circuit. Typical Wi-Fi chipsets (e.g., 802.11 chipsets) can perform LO feedthrough calibration to bring the LO feedthrough to 30-35 dB below the desired signal level. Even though the LO feedthrough has no impacts on the transmitter error vector magnitude (EVM), it can cause issues for the direct conversion Wi-Fi receivers by manifesting as large baseband offsets.

Thus an external gain can be applied in the compensator circuit to improve the gain (e.g., dBc) of the LO feedthrough, which can be used to prime the TX path. The LO feedthrough can be tuned on the compensator circuit to increase LO feedthrough levels as shown by graph 1800. The level can be controlled such that the compensator circuit can be triggered to turn on the active amplification stages while still meeting 802.11 specifications of −15 dBc for orthogonal frequency-division multiplexing (OFDM) frames. The driver amplifier gain (e.g., the first amplifier 402) can be adjusted to deliver no less than −10 dBm, and the RX detector driver amplifier gain (e.g., the second amplifier 412) can be similarly adjusted to maintain the required signal level difference to mitigate false TX triggering. Radio sequencing can be further optimized during the TX mode to turn on the PA 302 as early as possible, which can require tuning to ensure the stability of the PA. Once that PA is turned on, the LO feedthrough can be present at the input of the compensator circuit. By jointly optimizing the above steps, an optimal combination can be achieved that meets the performance requirements for specification and compliance with LO feedthrough levels, PA timing that leads to a stable PA turn-on, and compensator circuit turn-on that is timely and reliable for the TX frame with little to no loss of the preamble (e.g., the STF).

FIG. 19 is a table 1900 that shows a physical definition of a short interframe space (SIFS) and a slot time according to one embodiment. A second method to prime the TX path of the first RF signal in the TX mode prior to data transmission is to use a programmable timer to turn on the TX path following the RX mode. For example, the compensator circuit can send the first RF signal after an expiration of a fixed amount of time corresponding to the programmable timer. The fixed amount of time can be based on a predetermined time defined by a protocol implementing the second method to prime the TX path. Wi-Fi RX frames (such was 802.11 frames) can be followed by TX frames with a specific timing requirement, which can be utilized to turn on the compensator circuit by anticipating the TX frames and setting up a timer after the RX frame is finished. In one embodiment, the fixed amount of time can be predefined in 802.11 protocol.

Figure 20:
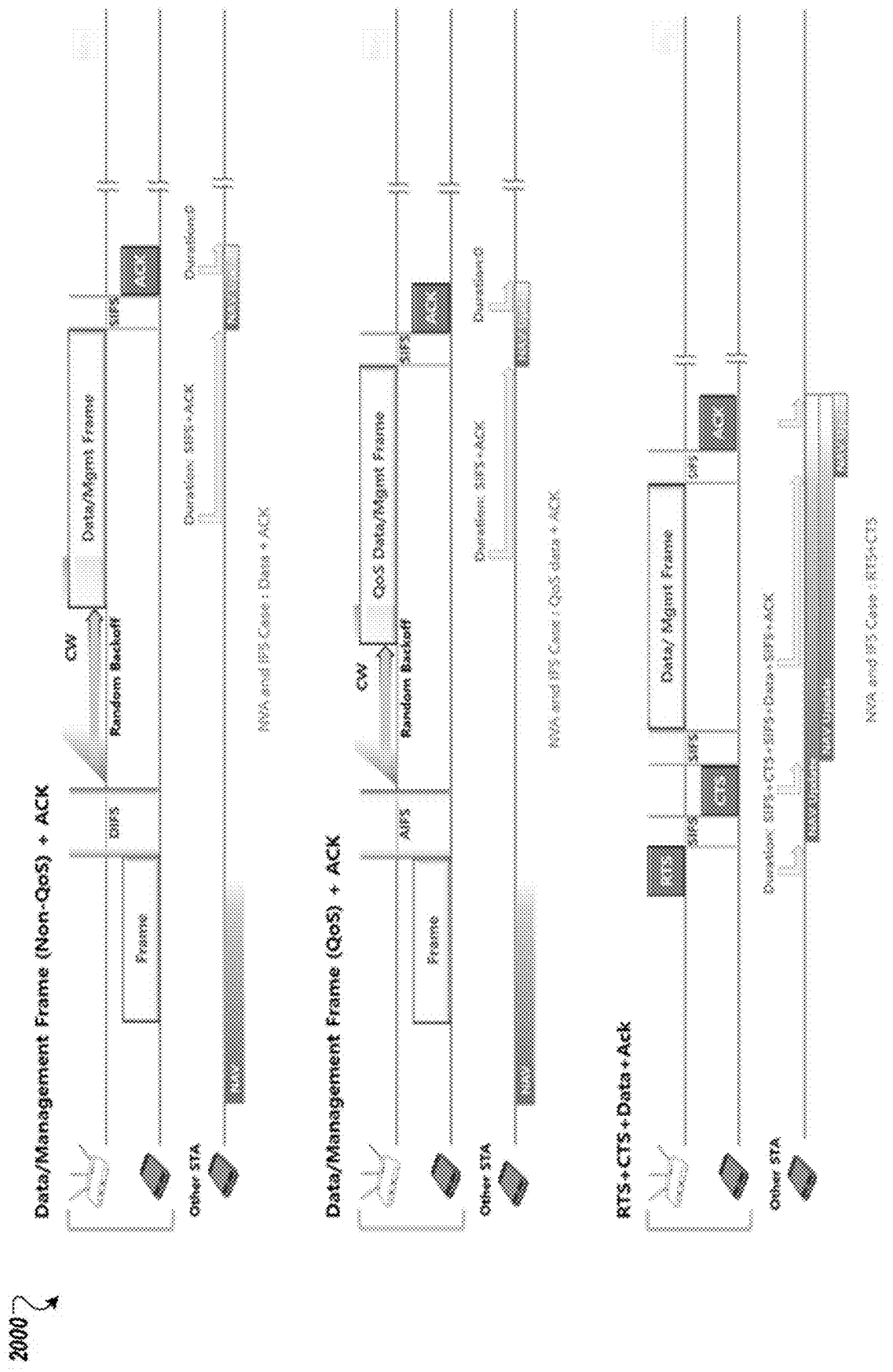
FIG. 20 is a diagram that illustrates cases on interframe space according to one embodiment.

FIG. 20 is a diagram 2000 that illustrates cases on interframe space according to one embodiment. For the second method to prime the TX path, a programmable timer (e.g., using a timer integrated circuit (IC)) for a time duration can be set up on the compensator circuit. In one embodiment, the time duration can be approximately 16 us. In other embodiments, the time duration can be other amounts of time. The active TX amplification can be turned on after an expiration of an amount of time corresponding to the time duration. In some cases, some types of frames (e.g., beacon reception and multicast frames) can cause the TX path to be falsely triggered, or turned on. In order to handle false TX triggering, the comparator on the TX path can be used to turn off the TX amplification as soon as possible if no TX signal is detected. In such a way, there can be a slight power consumption by the false TX triggering, but does not cause any issues from an 802.11 protocol standpoint since the 802.11 chipset itself does not have a TX path circuitry that is powered on for false TX triggering.

Figure 21:
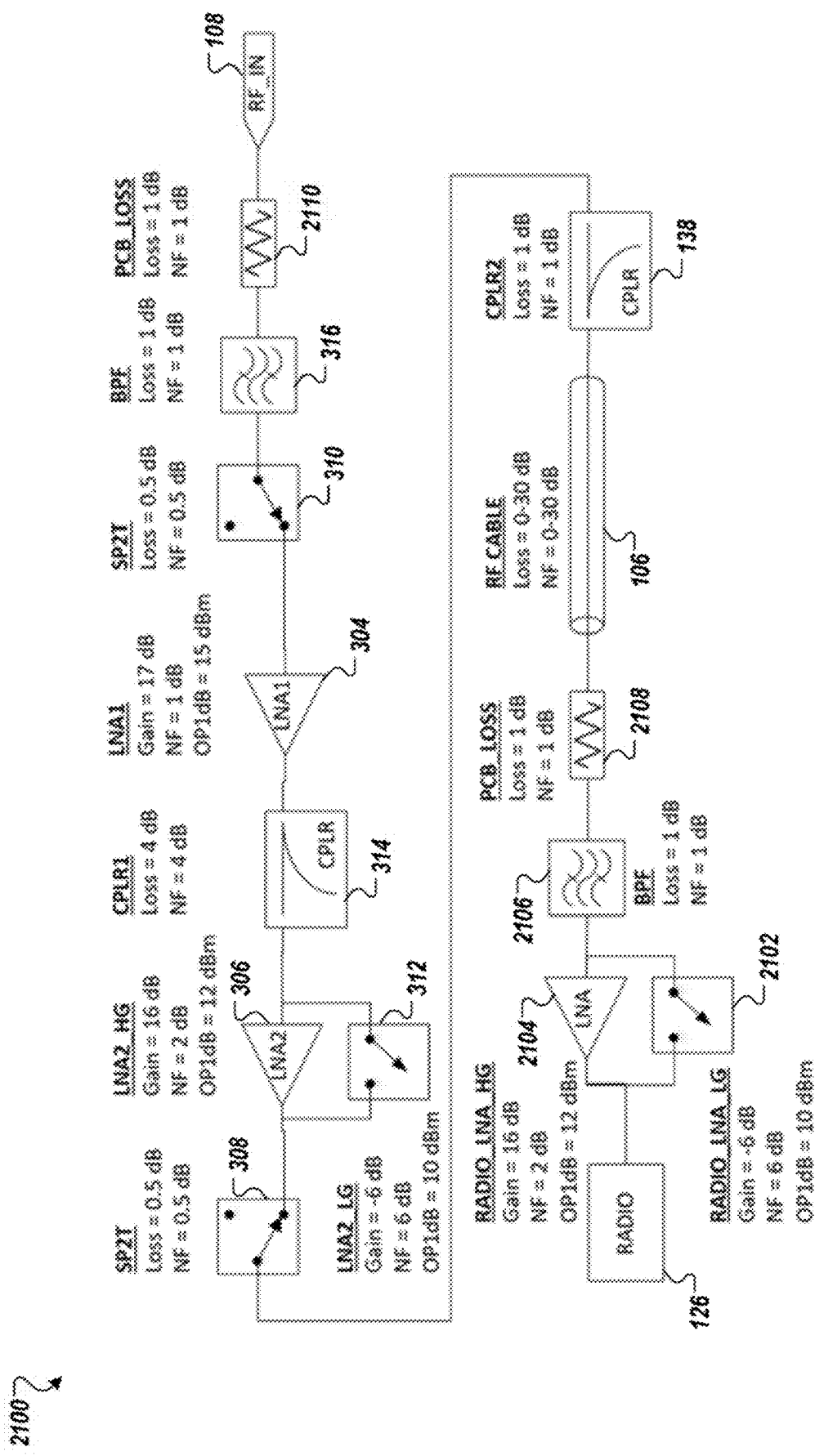
FIG. 21 is a schematic diagram of an RF system budget of a receive (RX) chain of a communication device with a cable-loss compensator system according to one embodiment.

FIG. 21 is a schematic diagram of an RF system budget of an RX chain of a communication device 2100 with a cable-loss compensator system according to one embodiment. Although not all components of the communication device 2100 are shown, the communication device 2100 is the same or similar as the communication device 100 of FIG. 1 as noted by similar reference numbers. Each component of the communication device has a loss including losses from the circuit board (e.g., the PCB). The communication device 2100 includes an RF port 108 that can be coupled to an antenna or another RF input to receive an RF signal. A BPF 316 is coupled to the RF port 108. When the compensator circuit detects that there is no TX signal, the switches 310 and 308 can be configured to route the RF signal over the RX path in the RX mode. The RX path includes a first LNA 304 and a directional coupler 314 is coupled to the output of the first LNA. The directional coupler 314 generates a copy of the RF signal. If the RF signal is sufficiently strong, meaning that a DC detection voltage signal generated by the RX peak power detection circuit is greater than a reference voltage, then the RF signal does not need to be amplified a second time. The switch 312 can be configured to be closed and the RF signal is routed past the second LNA 306 (e.g., the RF signal bypasses the second LNA 306). If the DC detection voltage signal is less than the reference voltage, the switch 312 is configured to be opened and the RF signal is routed through the second LNA 306 to be amplified. The RF signal is routed through directional coupler 138 and to the radio 126 via the RF cable 106. A BPF 2106 is coupled to the RF cable on the radio device. A third LNA 2104 and a switch 2102 are coupled between the BPF 2106 to further amplify the RF signal when it is weak. Each of the components in FIG. 21 indicates a loss or gain associated with the component. Further, there are PCB losses that are represented by resister 2108 and 2110.

An RX dynamic range defines the range of detectable signal levels (e.g., of the second RF signal) between a thermal noise floor and linear operation. FIG. 21 shows the RX block diagram indicating gains, losses, noise figure (NF), and output power at 1 dB compression (OP1dB) for each component on the RX path between the RF input port and the radio 126. It should be noted that both the compensator circuit and the radio are independently capable of high gain (HG) and low gain (LG) LNA operation. It should be noted that the both HG and LG LNA operation values are indicated on FIG. 21 where the given LNA can operate in either mode.

Figure 22A:
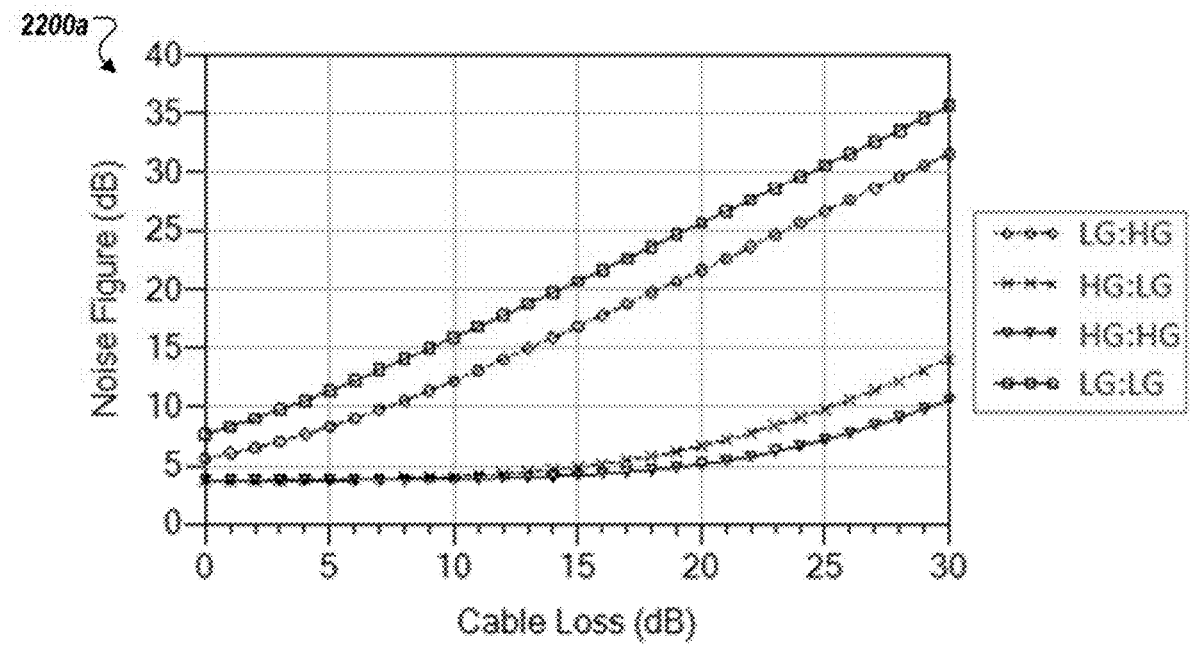
FIG. 22A is a graph that illustrates a system noise figure (NF) for each combination of compensator and radio gain modes according to one embodiment.

FIG. 22A is a graph 2200a that illustrates a system noise figure (SNF) for each combination of compensator and radio gain modes according to one embodiment. There are four total gain modes that can be achieved by switching the second LNA 306 between HG and LG modes (e.g., by opening and closing the switch 312 respectively) and by switching the third LNA 2104 between HG and LG modes (e.g., by opening and closing the switch 2102 respectively). The four combinations are for the second LNA 306 and the third LNA 2104 (indicated as LNA 306 mode: LNA 2104 mode) are LG:HG, HG:LG, HG:HG, and LG:LG.

The compensator circuit noise characteristics dominate the system noise figure for both HG and LG modes. There is no significant reduction in the system sensitivity until the cable loss exceeds 20 dB. At 30 dB of cable loss of the RF cable, the sensitivity can be degraded by 6 dB which can still be acceptable for some applications.

Figure 22B:
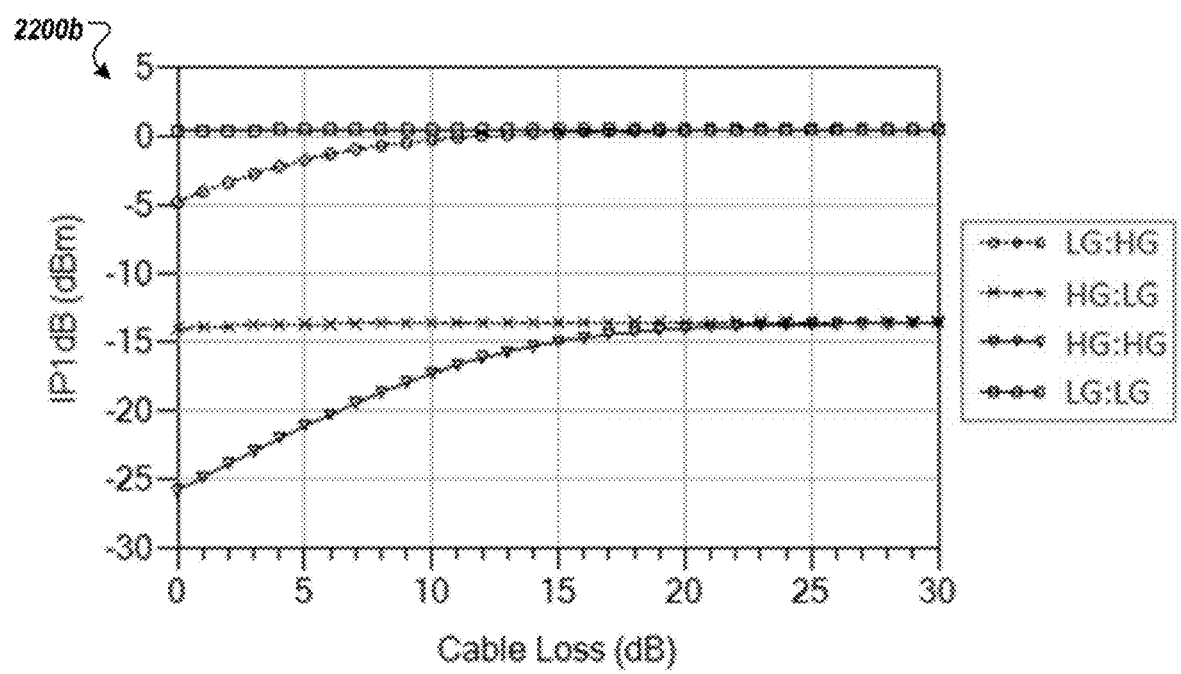
FIG. 22B is a graph that illustrates an input power as a function of RF cable loss according to one embodiment.

FIG. 22B is a graph 2200b that illustrates an input power as a function of RF cable loss according to one embodiment. The input power represents RX system linearity and the graph 2200b shows the RX system linearity for different gain combinations of the second LNA 306 and the third LNA 2104 as described above. IP1dB represents input power at 1 dB compression. When the RF cable loss is high, the compensator circuit linearity dominates the system IP1dB resulting in two cases (HG and LG). The worst case maximum input power of −26 dBm occurs for zero cable loss when both the second LNA 306 and the third LNA 2104 are in HG mode. Therefore, an LNA bypass mode should be triggered by the second DC detection voltage signal corresponding to the second RF signal should be triggered below this power level. Further, the threshold power level for the LNA bypass mode can be set even lower to improve the receiver linearity (which is MCS EVM dependent) to avoid a false TX trigger.

Figure 23:
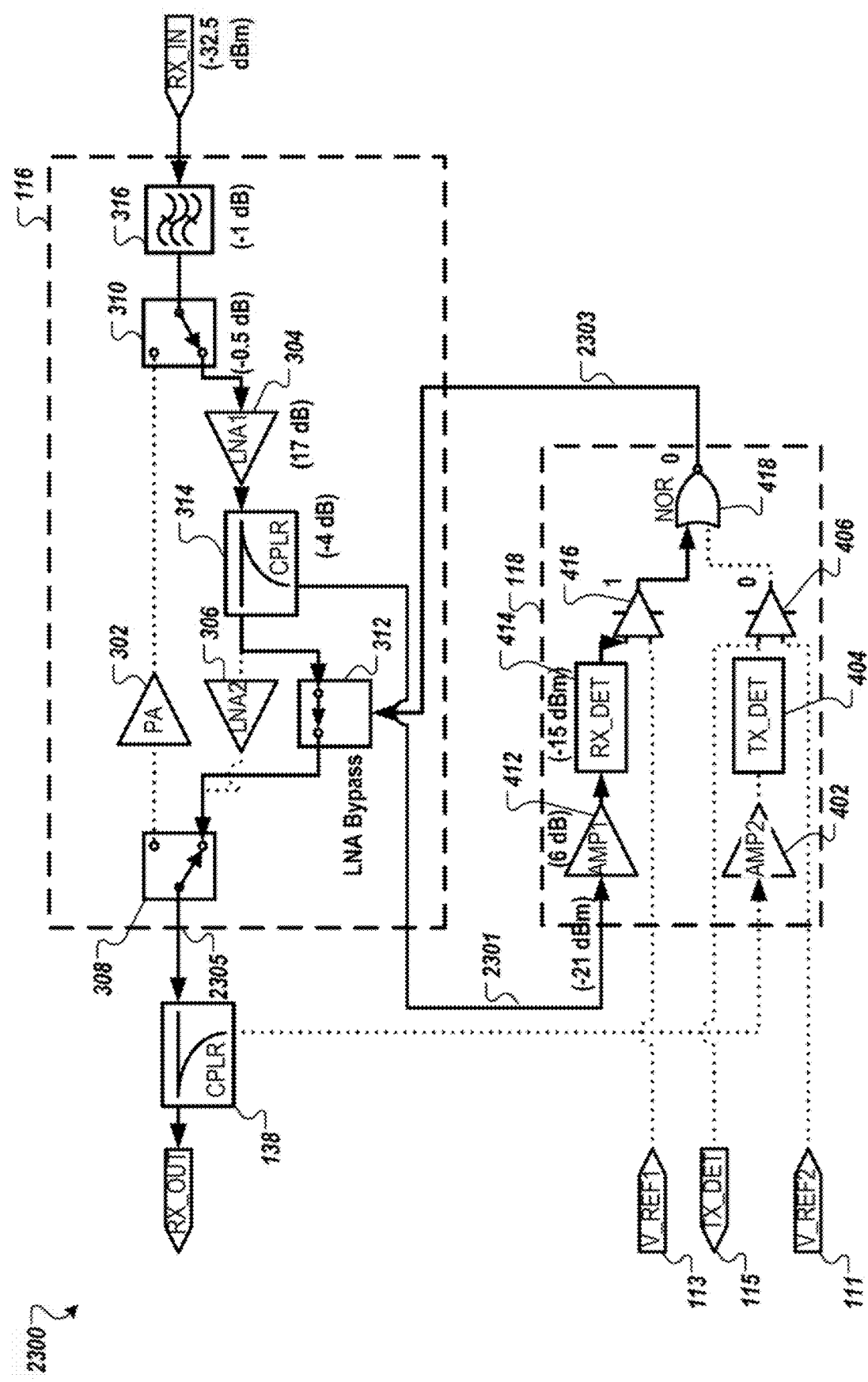
FIG. 23 is a schematic diagram of compensator circuit of a communication device with a cable-loss compensator system according to one embodiment.

FIG. 23 is a schematic diagram of compensator circuit 102 of a communication device 2300 with a cable-loss compensator system according to one embodiment. Although not all components of the communication device 2300 are shown, the communication device 2300 is the same or similar as the communication device 100 of FIG. 1 as noted by similar reference numbers. The FEM circuit 116 is the same as the FEM circuit 116 as described with respect to FIG. 3 and the FEM control circuit 118 is the same as the FEM control circuit 118 as described with respect to FIG. 4. In FIG. 13, the communication device 2300 is operating in an RX mode.

The RX detection circuit 414 is designed to bypass the second LNA 306 (e.g., the antenna LNA) at a threshold power or voltage level before driving the radio receiver into compression. The threshold value can depend on the cable loss of the RF cable as well as a dynamic range of the radio receiver. FIG. 23 shows the RX path in an LNA bypass mode. A strong RX signal (e.g., the second RF signal) is input into the second amplifier 412 along path 2301 and is then input into the RX detection circuit 414 (RX_DET). The RX detection circuit 414 outputs the second DC detection voltage signal. When the second DC detection voltage signal is greater than the second reference voltage 113 generated by the power supply circuit 120 (not shown in FIG. 23), the output of the second comparator 416 causes the output to swing high. The output of the second comparator 416 is a first input into the NOR logic gate 418, and when there is no TX signal, the output of the first comparator 406 is low and is a second input into the NOR logic gate 418. As a result, the LNA bypass pin is pushed low via path 2303 which bypasses the second LNA 306 and reduces the output of the compensator circuit to the RF cable 106 by approximately 20 dB via a path 2305.

Figure 24:
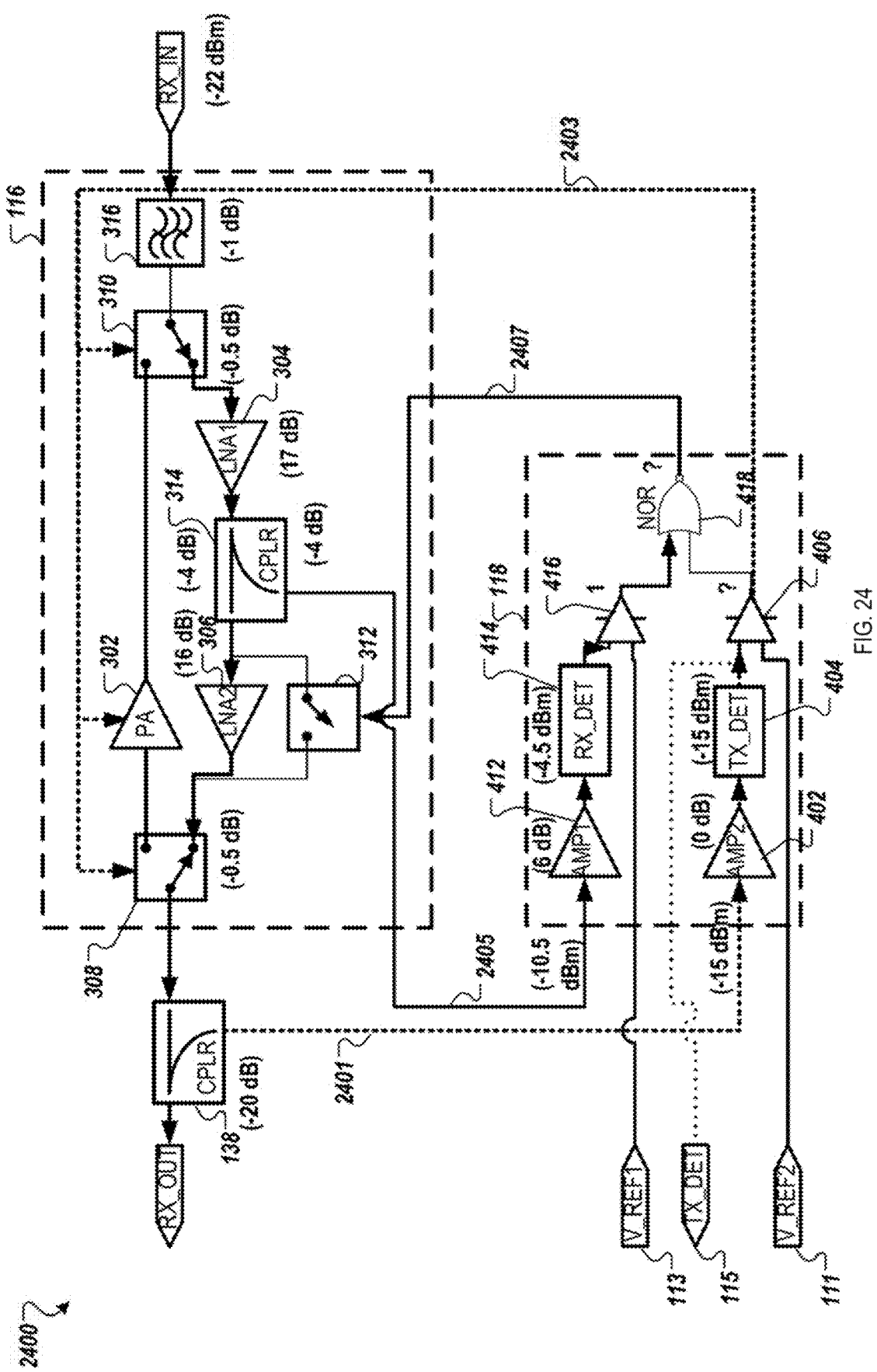
FIG. 24 is a schematic diagram of compensator circuit of a communication device with a cable-loss compensator system according to one embodiment.

FIG. 24 is a schematic diagram of compensator circuit 102 of a communication device 2400 with a cable-loss compensator system according to one embodiment. Although not all components of the communication device 2400 are shown, the communication device 2400 is the same or similar as the communication device 100 of FIG. 1 as noted by similar reference numbers. The FEM circuit 116 is the same as the FEM circuit 116 as described with respect to FIG. 3 and the FEM control circuit 118 is the same as the FEM control circuit 118 as described with respect to FIG. 4. In some cases, a strong RX signal (e.g., a second RF signal) can falsely enable the TX chain due to RX signal leakage through the output RX OUT of the compensator circuit to the RF cable and the radio (not shown in FIG. 24). In other words, when the second RF signal is routed through the RF cable, it has to pass through the directional coupler 138, at which point some of the second RF signal can leak into the TX path along path 2401. In such a case, the NOR logic gate 418 causes TX mode operation and TX path enablement by disabling the LNA and enabling the PA 302 via path 2403. Based on component gains and losses, e.g., as described with respect to FIG. 12 and FIG. 21, this condition can be expected to happen at −22 dBm of received input power from the second RF signal. To avoid this condition of falsely triggering the TX path, the detector input levels (e.g., the RX detection circuit 414 and the TX detection circuit 404) can be adjusted such that the LNA bypass mode always triggers first. This can be achieved by making a second copy of the second RF signal using the directional coupler 314 and routing the second copy to the RX path via path 2405 and back to the switch 312 via path 2407 for LNA bypass. Bypassing the LNA first reduces the input level of the TX detection circuit 404 by approximately 20 dB, which can avoid the false TX path trigger condition.

Figure 25:
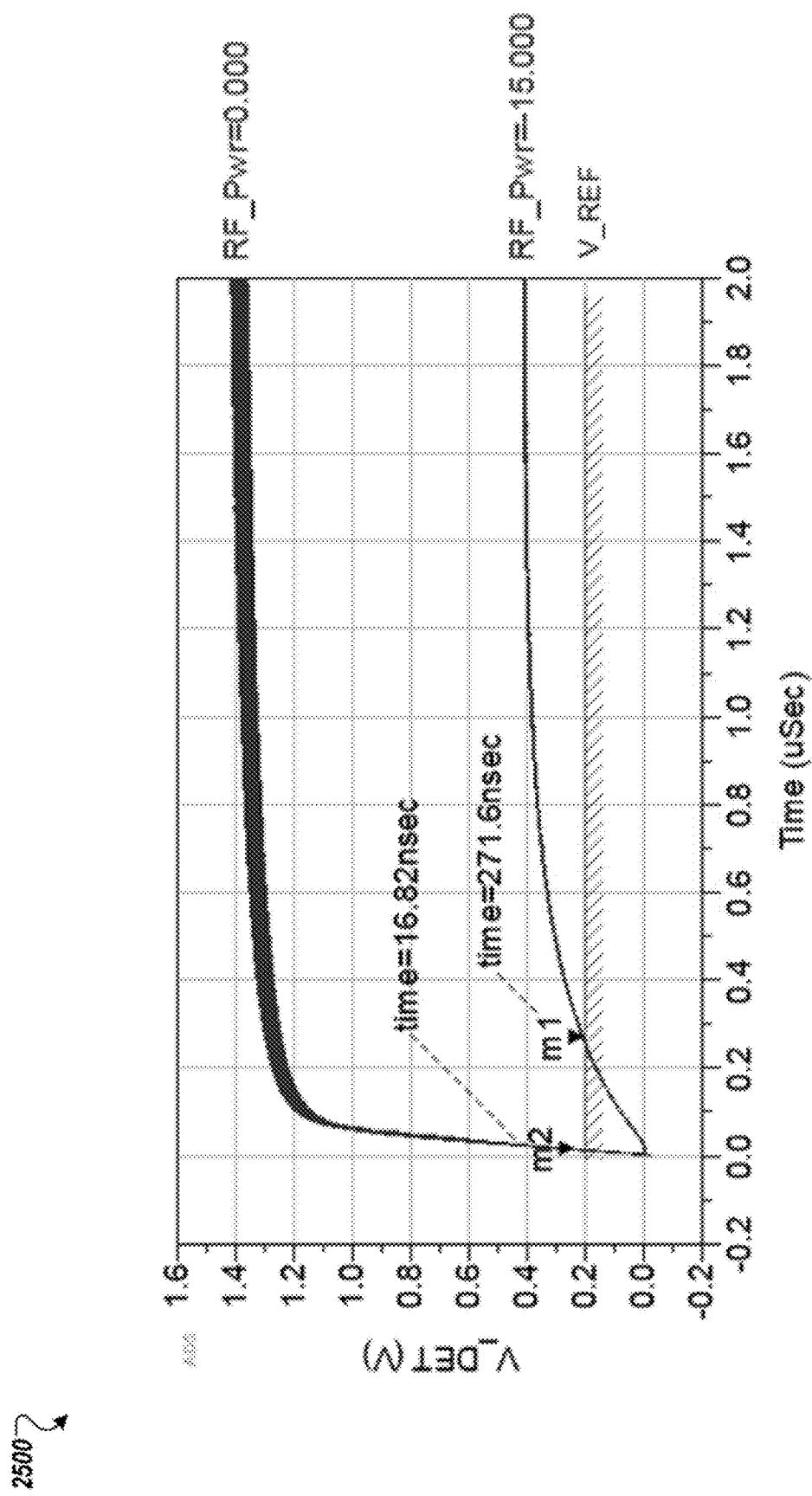
FIG. 25 is a graph that illustrates a transient response delay of the RF detectors according to one embodiment.

FIG. 25 is a graph 2500 that illustrates a transient response delay of the RF detectors according to one embodiment. The RF detectors can refer to the RX detection circuit 414 or the TX detection circuit 404. Graph 2500 is a simulated time-domain response of the RF detector circuits for two different input power levels. The low power signal (−15 dBm) can be delayed by more than 250 ns relative to the strong signal (0 dBm) for a reference voltage (e.g., the first reference voltage 111 for the TX detection circuit 404 or the second reference voltage 113 for the RX detection circuit 414) of 200 mV. The time delay between signals of different amplitudes can be increased by increasing the reference voltages. Additional control can be enabled by amplifier stages of the first amplifier 402 and the second amplifier 412 to set input levels to the TX detection circuit 404 and the RX detection circuit 414 respectively.

Figure 26:
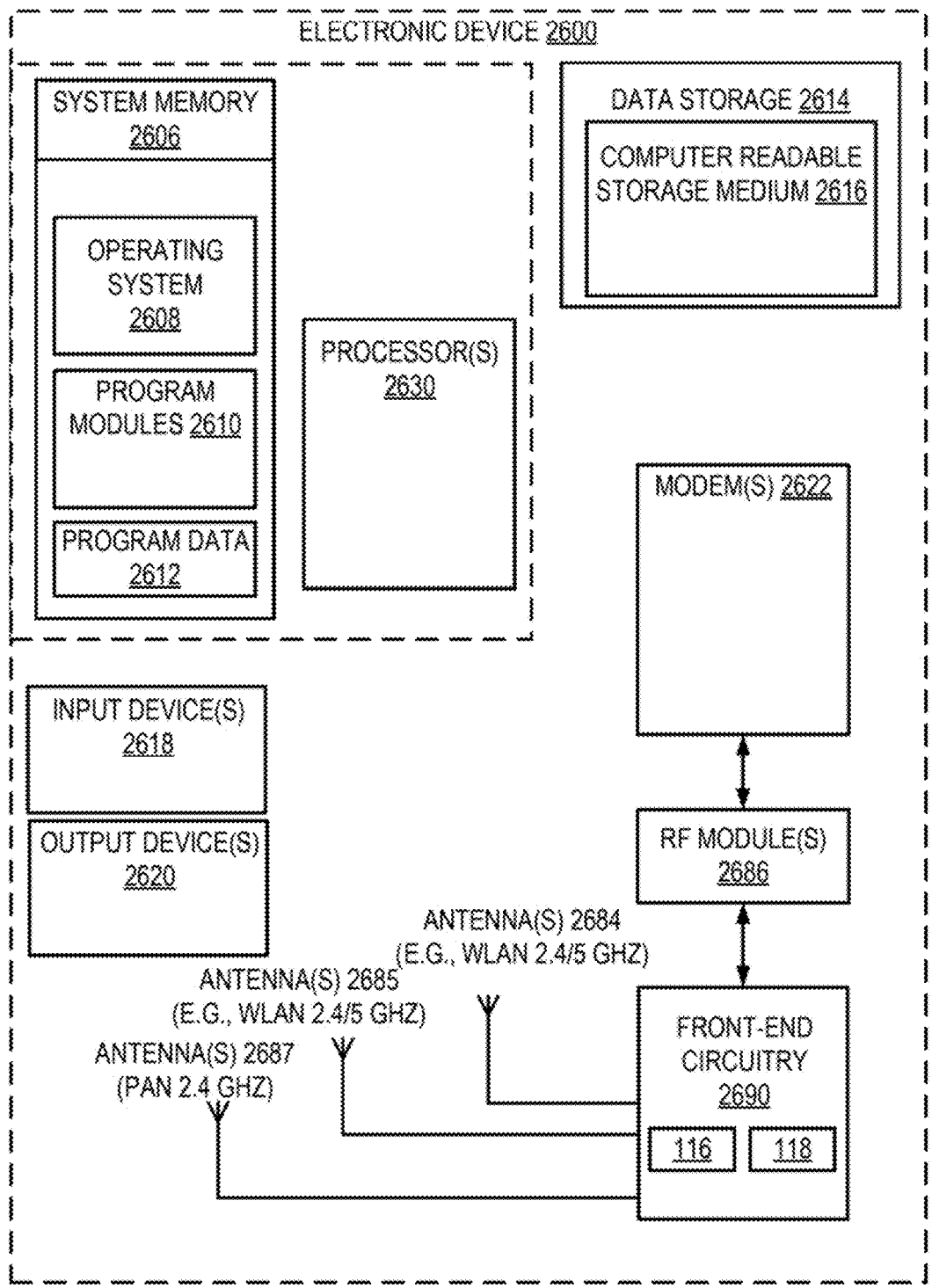
FIG. 26 is a block diagram of an electronic device that can be configured for cable-loss compensation as described herein according to one embodiment.

FIG. 26 is a block diagram of an electronic device 2600 that can be configured for cable-loss compensation as described herein according to one embodiment. The electronic device 2600 may correspond to the electronic devices described above with respect to FIGS. 1-25. In one embodiment, the electronic device 2600 is a communication device with a cable-loss compensation system, such as the communication device In one embodiment, the electronic device 2600 is a communication device with a cable-loss compensation system described herein such as the communication device 100 of FIG. 1, the communication device 300 of FIG. 3, the communication device 400 of FIG. 4, the communication device 500a of FIG. 5A, the communication device 500b of FIG. 5B, the communication device 700 of FIG. 7, the communication device 800 of FIG. 8, the communication device 1000 of FIG. 10, the communication device 1100 of FIG. 11, the communication device 1200 of FIG. 12, the communication device 1300 of FIG. 13, the communication device 1400 of FIG. 14, the communication device 1500 of FIG. 15, the communication device 2100 of FIG. 21, the communication device 2300 of FIG. 23, and the communication device 2400 of FIG. 24. In another embodiment, the electronic device 2600 includes the compensator circuit 102. The compensator circuit 102 can include the circuitry described above with respect to FIGS. 1-5. In a further embodiment, the electronic device 2600 further includes the radio device 104 and the RF cable 106 described herein. Alternatively, the electronic device 2600 may be other electronic devices, as described herein.

The electronic device 2600 includes one or more processor(s) 2630, such as one or more CPUs, microcontrollers, field programmable gate arrays, or other types of processors. The electronic device 2600 also includes system memory 2606, which may correspond to any combination of volatile and/or non-volatile storage mechanisms. The system memory 2606 stores information that provides operating system component 2608, various program modules 2610, program data 2612, and/or other components. In one embodiment, the system memory 2606 stores instructions of methods to control operation of the electronic device 2600. The electronic device 2600 performs functions by using the processor(s) 2630 to execute instructions provided by the system memory 2606. In one embodiment, the program modules 2610 may include cable-loss compensator circuitry and logic that may perform some or all of the operations described herein.

The electronic device 2600 also includes a data storage device 2614 that may be composed of one or more types of removable storage and/or one or more types of non-removable storage. The data storage device 2614 includes a computer-readable storage medium 2616 on which is stored one or more sets of instructions embodying any of the methodologies or functions described herein. Instructions for the program modules 2610 (e.g., coordinated dynamic analog beamforming logic 2634) may reside, completely or at least partially, within the computer-readable storage medium 2616, system memory 2606 and/or within the processor(s) 2630 during execution thereof by the electronic device 2600, the system memory 2606 and the processor(s) 2630 also constituting computer-readable media. The electronic device 2600 may also include one or more input devices 2618 (keyboard, mouse device, specialized selection keys, etc.) and one or more output devices 2620 (displays, printers, audio output mechanisms, etc.).

The electronic device 2600 further includes a modem 2622 to allow the electronic device 2600 to communicate via a wireless connections (e.g., such as provided by the wireless communication system) with other computing devices, such as remote computers, an item providing system, and so forth. The modem 2622 can be connected to one or more radio frequency (RF) modules 2686. The RF modules 2686 may be a WLAN module, a WAN module, wireless personal area network (WPAN) module, Global Positioning System (GPS) module, or the like. The antenna structures (antenna(s) 2684, 2685, 2687) are coupled to the front-end circuitry 2690, which is coupled to the modem 2622. The front-end circuitry 2690 may include radio front-end circuitry, antenna switching circuitry, impedance matching circuitry, or the like. The front-end circuitry 2690 can also include the FEM circuit 116 and the FEM control circuit 118 for performing cable-loss compensation. The antennas 2684 may be GPS antennas, Near-Field Communication (NFC) antennas, other WAN antennas, WLAN or PAN antennas, or the like. The modem 2622 allows the electronic device 2600 to handle both voice and non-voice communications (such as communications for text messages, multimedia messages, media downloads, web browsing, etc.) with a wireless communication system. The modem 2622 may provide network connectivity using any type of mobile network technology including, for example, Cellular Digital Packet Data (CDPD), General Packet Radio Service (GPRS), EDGE, Universal Mobile Telecommunications System (UMTS), Single-Carrier Radio Transmission Technology (1×RTT), Evaluation Data Optimized (EVDO), High-Speed Down-Link Packet Access (HSDPA), Wi-Fi®, Long Term Evolution (LTE) and LTE Advanced (sometimes generally referred to as 4G), etc.

The modem 2622 may generate signals and send these signals to antenna(s) 2684 of a first type (e.g., WLAN 5 GHz), antenna(s) 2685 of a second type (e.g., WLAN 2.4 GHz), and/or antenna(s) 2687 of a third type (e.g., WAN), via front-end circuitry 2690, and RF module(s) 2686 as descried herein. Antennas 2684, 2685, 2687 may be configured to transmit in different frequency bands and/or using different wireless communication protocols. The antennas 2684, 2685, 2687 may be directional, omnidirectional, or non-directional antennas. In addition to sending data, antennas 2684, 2685, 2687 may also receive data, which is sent to appropriate RF modules connected to the antennas. One of the antennas 2684, 2685, 2687 may be any combination of the antenna structures described herein.

In one embodiment, the electronic device 2600 establishes a first connection using a first wireless communication protocol, and a second connection using a different wireless communication protocol. The first wireless connection and second wireless connection may be active concurrently, for example, if an electronic device is receiving a media item from another electronic device via the first connection) and transferring a file to another electronic device (e.g., via the second connection) at the same time. Alternatively, the two connections may be active concurrently during wireless communications with multiple devices. In one embodiment, the first wireless connection is associated with a first resonant mode of an antenna structure that operates at a first frequency band and the second wireless connection is associated with a second resonant mode of the antenna structure that operates at a second frequency band. In another embodiment, the first wireless connection is associated with a first antenna structure and the second wireless connection is associated with a second antenna.

Though a modem 2622 is shown to control transmission and reception via antenna (2684, 2685, 2687), the electronic device 2600 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A cable-loss compensator system comprising:
    a device comprising:
        a processor;
        a time domain duplexed (TDD) radio that sends a first radio frequency (RF) signal in a transmit (TX) mode of the cable-loss compensator system or receives a second RF signal in a receive (RX) mode of the cable-loss compensator system;
        an analog-to-digital converter (ADC) that converts a first direct current (DC) detection voltage signal into digital data;
        a DC power source that provides a DC power signal at a first voltage value; and
        a first triplexer coupled to the DC power source, the ADC, and the TDD radio;
    an RF cable coupled to the first triplexer at a first end of the RF cable, the first triplexer multiplexing the first RF signal, the second RF signal, the DC power signal, and the first DC detection voltage signal on the RF cable; and
    a compensator circuit coupled to a second end of the RF cable, the compensator circuit comprising:
        a second triplexer coupled to the second end of the RF cable, the second triplexer multiplexing the first RF signal, the second RF signal, the DC power signal, and the first DC detection voltage signal on the RF cable;
        a front-end module (FEM) circuit coupled to the second triplexer, the FEM circuit comprising a power amplifier (PA) and a low-noise amplifier (LNA), wherein the FEM circuit is powered by the DC power signal via the RF cable and sends the first RF signal to an antenna coupled to the FEM circuit or receives the second RF signal via the antenna; and
        a control circuit coupled to the second triplexer, wherein the control circuit is powered by the DC power signal via the RF cable and receives the first RF signal, converts the first RF signal to the first DC detection voltage signal, and sends the first DC detection voltage signal back to the ADC via the RF cable, wherein the control circuit sends a first enable signal to the FEM circuit, in the TX mode, to enable a TX path in the FEM circuit, the first enable signal enabling the PA in the TX path; and wherein the processor determines an insertion loss of the RF cable using the digital data from the ADC and adjusts a transmit power level of the first RF signal by increasing or decreasing the first voltage value to a second voltage value according to the insertion loss.

2. The cable-loss compensator system of claim 1, further comprising:
    a power supply circuit, wherein the power supply circuit generates a regulated voltage to power the control circuit and the FEM circuit, a first reference voltage, and a second reference voltage, wherein:
        the FEM circuit further comprises a second LNA and a bypass circuit and the control circuit determines that the first DC detection voltage signal is greater than the first reference voltage and sends the first enable signal to the FEM circuit; or the control circuit measures an input power level of the second RF signal, converts the second RF signal to a second DC detection voltage signal, determines that the second DC detection voltage signal is greater than the second reference voltage, and sends a second enable signal to the FEM circuit, the second enable signal enabling the bypass circuit to allow the second RF signal to bypass the second LNA.

3. An apparatus comprising:

a first port configured to couple to a first end of a radio frequency (RF) cable;

a second port configured to couple to an antenna;

a triplexer coupled to the first port, the triplexer being configured, (i) in a first mode, to receive a first RF signal and a direct-current (DC) power signal from a device coupled to a second end of the RF cable and send a first detection signal to the device via the RF cable, and (ii) in a second mode, to send a second RF signal to the device, wherein the first detection signal is indicative of a transmit power level of the first RF signal, the transmit power level being indicative of an insertion loss of the RF cable;

a front-end module (FEM) circuit coupled to the triplexer, the FEM circuit comprising a power amplifier (PA) and a low-noise amplifier (LNA); and a control circuit coupled to the triplexer, the control circuit comprising:

first circuitry that measures the transmit power level of the first RF signal, converts the first RF signal into the first detection signal, sends the first detection signal to the device via the RF cable, and enables the PA; and second circuitry that measures a receive power level of a second RF signal in a second mode, wherein an RX path of the FEM circuit is enabled in the second mode, the RX path comprising the LNA.

4. The apparatus of claim 3, wherein the FEM circuit further comprises a second LNA and a bypass circuit, wherein the second circuitry converts the second RF signal into a second detection signal, and enables the bypass circuit that allows the second RF signal to bypass the second LNA.

5. The apparatus of claim 4, further comprising:

a power supply circuit coupled to the triplexer, the power supply circuit (i) receives the DC power signal via the triplexer and provides a regulated voltage to the control circuit and the FEM circuit, and (ii) generates a first reference voltage, wherein:

the control circuit determines that a voltage of the first RF signal is greater than the first reference voltage and causes the FEM circuit to enable the PA; or the control circuit determines that the voltage of the first RF signal is less than the first reference voltage and causes the FEM circuit to enable the LNA.

6. The apparatus of claim 3, wherein the FEM circuit further comprises:

a second LNA;
a bypass circuit;
a coupler; and a power supply circuit coupled to the triplexer, the power supply circuit (i) receives the DC power signal via the triplexer and provides a regulated voltage to power the control circuit and the FEM circuit, and (ii) generates a first reference voltage and a second reference voltage, wherein:

the control circuit determines that a voltage of the first RF signal is greater than the first reference voltage; and causes the FEM circuit to enable the PA and transmit the first RF signal via the antenna coupled to the second port; or the coupler generates a third RF signal based on the second RF signal;

the control circuit determines that a voltage of the third RF signal is greater than the second reference voltage; and causes the FEM circuit to enable the bypass circuit and sends the second RF signal to a radio of the device via the RF cable, wherein the bypass circuit allows the second RF signal to bypass the second LNA.

7. The apparatus of claim 3, wherein the control circuit further comprises:

a first detection circuit that receives the first RF signal and outputs a first voltage signal;

a first comparator coupled to the first detection circuit, the first comparator compares the first voltage signal to a first reference signal and outputs a first signal, wherein the first signal is configured to enable the PA in the first mode and enable the LNA in the second mode;

a second detection circuit that receives the second RF signal and outputs a second voltage signal;

a second comparator coupled to the second detection circuit, the second comparator compares the second voltage signal to a second reference signal and outputs a second signal; and a logic gate coupled to the first comparator and the second comparator, the logic gate receives the first signal and the second signal and outputs a third signal, wherein the third signal enables a bypass circuit of the FEM circuit in the second mode.

8. The apparatus of claim 3, wherein the control circuit further comprises an RF detection circuit comprising:

the first port that receives the first RF signal;

a second port coupled to the triplexer; and a plurality of multiplier stages coupled in series between the first port and the second port, wherein the plurality of multiplier stages receive the first RF signal and output the first detection signal via the second port, each of the plurality of multiplier stages comprising:

a half-wave multiplier circuit; and an inductor coupled in series to the half-wave multiplier circuit.

9. The apparatus of claim 3, wherein the control circuit further comprises an RF detection circuit that receives the first RF signal and generates the first detection signal.

10. The apparatus of claim 3, wherein the triplexer comprises a voltage-to-current converter that converts the first RF signal to a current signal, the current signal corresponding to the first detection signal.

11. The apparatus of claim 3, further comprising:

a third port coupled to a second RF cable;

a fourth port coupled to a second antenna;

a diplexer coupled to the third port, wherein the diplexer (i) in the first mode, receives a third RF signal and a second DC power signal from the device and (ii) in the second mode, sends a fourth RF signal to the device; and a second FEM circuit coupled to the diplexer and the control circuit, the second FEM circuit comprising a second PA and a third LNA.

12. The apparatus of claim 11, further comprising a power supply circuit coupled to the triplexer and the diplexer, the power supply circuit (i) receives a first DC power signal from a first DC power source via the RF cable and a second DC power signal from a second DC power source via the second RF cable and (ii) generates a regulated voltage, a first reference voltage, and a second reference voltage, wherein the first DC power signal and the second DC power signal are combined to generate the regulated voltage to power the control circuit, the FEM circuit, and the second FEM circuit.

13. The apparatus of claim 3, further comprising:
a plurality of triplexers coupled to at least one RF cable, the plurality of triplexers receives a plurality of DC signals from a DC power source via the at least one RF cable, and converts the plurality of DC signals to a plurality of DC voltage signals, wherein the triplexer receives a DC signal from the DC power source via the at least one RF cable and converts the DC signal to a DC voltage signal;
a DC summation circuit receives the DC voltage signal and the plurality of DC voltage signals, sums the DC voltage signal and the plurality of DC voltage signals and generates a summed DC voltage signal; and
a power supply circuit that receives the summed DC voltage signal and generates a regulated voltage, a first reference voltage, and a second reference voltage, the regulated voltage being provided to at least the control circuit and the FEM circuit.

14. A system comprising:
a radio frequency (RF) cable;
a device coupled to a first end of the RF cable, the device comprising:
    a radio that sends a first RF signal in a first mode and receives a second RF signal in a second mode; and
    a first triplexer coupled to the radio, the first triplexer (i) in the first mode, sends the first RF signal and a direct-current (DC) power signal to a compensator circuit and receives a first detection signal from the compensator circuit, and (ii) in a second mode, receives the second RF signal; and
the compensator circuit comprising:
    a front-end module (FEM) circuit comprising a power amplifier (PA) and a low noise amplifier (LNA);
    a control circuit that:
        measures a transmit power level of the first RF signal in the first mode;
        converts the first RF signal into the first detection signal;
        sends the first detection signal to the device via the RF cable; and
        sends a first signal to the FEM circuit, wherein a first path of the FEM circuit is enabled in the first mode, the first path comprising the PA; and
    a second triplexer coupled to the FEM circuit and the control circuit, the second triplexer (i) in the first mode, receives the first RF signal and the DC power and sends the first detection signal via the RF cable, and (ii) in the second mode, sends the second RF signal to the device via the RF cable, wherein the device receives the first detection signal and adjusts the transmit power level of the first RF signal to a second transmit power level by increasing or decreasing the DC power to a second DC power, and wherein a second path of the FEM circuit is enabled in the second mode, the second path comprising the LNA.

15. The system of claim 14, wherein the FEM circuit further comprises a second LNA and a bypass circuit, the second LNA being enabled in the second mode, and the control circuit converts the second RF signal with a receive power level into a second detection signal, and enables the bypass circuit that allows the second RF signal to bypass the second LNA.

16. The system of claim 14, further comprising a power supply circuit coupled to the second triplexer, the power supply circuit (i) receives the DC power signal and provides a regulated voltage to power the control circuit and the FEM circuit, and (ii) generates a first reference voltage and a second reference voltage, wherein:
the control circuit determines that a voltage of the first RF signal is greater than the first reference voltage and causes the FEM circuit to enable the PA; and
the control circuit determines that a voltage of the first RF signal is less than the first reference voltage and causes the FEM circuit to enable the LNA.

17. The system of claim 14, wherein the first triplexer comprises:
a diplexer comprising a capacitor and an inductor, the diplexer isolates the first RF signal and the DC power signal; and
a current-to-voltage converter that converts a current signal comprising the second RF signal and the first detection signal to a voltage signal, wherein the first triplexer sends the first RF signal and the DC power signal as a current via the RF cable and receives the current signal as a current via the RF cable.

18. The system of claim 17, wherein the current-to-voltage converter comprises:
a first transistor that receives the current signal from the RF cable;
a second transistor that generates a copy of the current signal; and
a first resistor and a second resistor that converts the current signal to a voltage signal.

19. The system of claim 14, wherein the compensator circuit further comprises a local oscillator (LO) and sends the first signal based on a frequency of the LO.

20. The system of claim 14, wherein the radio receives the second RF signal via an antenna coupled to the FEM and the compensator circuit sends the first RF signal responsive to an expiration of a fixed amount of time.

* * * * *